(12) United States Patent
Matsubayashi

(10) Patent No.: US 9,812,458 B2
(45) Date of Patent: Nov. 7, 2017

(54) MEMORY DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Daisuke Matsubayashi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/240,328

(22) Filed: Aug. 18, 2016

(65) Prior Publication Data

US 2016/0358923 A1 Dec. 8, 2016

Related U.S. Application Data

(62) Division of application No. 13/410,610, filed on Mar. 2, 2012, now Pat. No. 9,425,107.

(30) Foreign Application Priority Data

Mar. 10, 2011 (JP) .................................. 2011-052448
May 19, 2011 (JP) .................................. 2011-112648

(51) Int. Cl.
*H01L 27/1156* (2017.01)
*H01L 27/108* (2006.01)
(Continued)

(52) U.S. Cl.
CPC .......... *H01L 27/1085* (2013.01); *C23C 14/08* (2013.01); *H01L 21/84* (2013.01);
(Continued)

(58) Field of Classification Search
CPC .. H01L 27/1203; H01L 21/84; H01L 29/7827; H01L 29/7869; H01L 27/1255; H01L 27/1156
See application file for complete search history.

(56) References Cited

U.S. PATENT DOCUMENTS 5,302,843 A 4/1994 Yamazaki
5,336,917 A 8/1994 Kohyama
(Continued)

FOREIGN PATENT DOCUMENTS

CN 101196656 A 6/2008
CN 101907807 A 12/2010
(Continued)

OTHER PUBLICATIONS

Kim.K, "Technology for sub-50nm DRAM and NAND Flash Manufacturing", IEDM 05: Technical Digest of International Electron Devices Meeting, Dec. 5, 2005, pp. 333-336.
(Continued)

*Primary Examiner* — Julia Slutsker
(74) *Attorney, Agent, or Firm* — Robinson Intellectual Property Law Office; Eric J. Robinson

(57) ABSTRACT

A memory device that is as small in area as possible and has an extremely long data retention period. A transistor with extremely low leakage current is used as a cell transistor of a memory element in a memory device. Moreover, in order to reduce the area of a memory cell, the transistor is formed so that its source and drain are stacked in the vertical direction in a region where a bit line and a word line intersect each other. Further, a capacitor is stacked above the transistor.

10 Claims, 17 Drawing Sheets

(51) Int. Cl.
   *H01L 21/84*      (2006.01)
   *H01L 27/105*     (2006.01)
   *H01L 27/115*     (2017.01)
   *H01L 27/12*      (2006.01)
   *H01L 49/02*      (2006.01)
   *H01L 29/786*     (2006.01)
   *C23C 14/08*      (2006.01)
   *H01L 27/06*      (2006.01)
   *H01L 27/11507*   (2017.01)
   *H01L 27/11514*   (2017.01)

(52) U.S. Cl.
   CPC ...... *H01L 27/105* (2013.01); *H01L 27/10885* (2013.01); *H01L 27/10891* (2013.01); *H01L 27/115* (2013.01); *H01L 27/1203* (2013.01); *H01L 27/1207* (2013.01); *H01L 27/1225* (2013.01); *H01L 27/1255* (2013.01); *H01L 28/40* (2013.01); *H01L 29/7869* (2013.01); *H01L 29/78642* (2013.01); *H01L 27/0688* (2013.01); *H01L 27/10814* (2013.01); *H01L 27/10823* (2013.01); *H01L 27/10876* (2013.01); *H01L 27/10894* (2013.01); *H01L 27/10897* (2013.01); *H01L 27/1156* (2013.01); *H01L 27/11507* (2013.01); *H01L 27/11514* (2013.01)

(56) References Cited

U.S. PATENT DOCUMENTS

| | | |
|---|---|---|
| 5,414,288 A | 5/1995 | Fitch et al. |
| 5,414,289 A | 5/1995 | Fitch et al. |
| 5,627,390 A | 5/1997 | Maeda et al. |
| 5,731,856 A | 3/1998 | Kim et al. |
| 5,744,864 A | 4/1998 | Cillessen et al. |
| 5,780,888 A | 7/1998 | Maeda et al. |
| 6,018,176 A | 1/2000 | Lim |
| 6,150,688 A | 11/2000 | Maeda et al. |
| 6,294,274 B1 | 9/2001 | Kawazoe et al. |
| 6,303,425 B1 | 10/2001 | Maeda et al. |
| 6,365,452 B1 | 4/2002 | Perng et al. |
| 6,383,860 B2 | 5/2002 | Maeda et al. |
| 6,563,174 B2 | 5/2003 | Kawasaki et al. |
| 6,727,522 B1 | 4/2004 | Kawasaki et al. |
| 6,734,484 B2 | 5/2004 | Wu |
| 6,878,990 B2 | 4/2005 | Yoo |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,120,046 B1 * | 10/2006 | Forbes .................. G11C 7/18 257/296 |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,714,408 B2 | 5/2010 | Tokunaga |
| 7,732,819 B2 | 6/2010 | Akimoto et al. |
| 7,755,126 B2 | 7/2010 | Kondo |
| 7,781,285 B2 | 8/2010 | Kim et al. |
| 7,855,153 B2 | 12/2010 | Ichijo et al. |
| 7,889,538 B2 | 2/2011 | Toda |
| 7,989,274 B2 | 8/2011 | Kang et al. |
| 8,036,010 B2 | 10/2011 | Maejima |
| 8,084,331 B2 | 12/2011 | Ofuji et al. |
| 8,148,727 B2 | 4/2012 | Kang et al. |
| 8,149,606 B2 | 4/2012 | Maejima |
| 8,203,882 B2 | 6/2012 | Hishida et al. |
| 8,324,699 B2 | 12/2012 | Ichijo et al. |
| 8,330,249 B2 | 12/2012 | Tokunaga |
| 8,513,731 B2 | 8/2013 | Lee et al. |
| 8,653,582 B2 | 2/2014 | Fukuzumi et al. |
| 9,177,872 B2 * | 11/2015 | Sandhu ............... H01L 21/8254 |
| 9,312,134 B2 | 4/2016 | Fukuzumi et al. |
| 9,318,503 B2 | 4/2016 | Fukuzumi et al. |
| 9,601,503 B2 | 3/2017 | Fukuzumi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2003/0234414 A1 * | 12/2003 | Brown ............... H01L 27/10808 257/300 |
| 2004/0038446 A1 | 2/2004 | Takeda et al. |
| 2004/0127038 A1 | 7/2004 | Carcia et al. |
| 2004/0206996 A1 * | 10/2004 | Lee .................... G11C 16/3427 257/296 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0077715 A1 | 4/2007 | Kang et al. |
| 2007/0090365 A1 | 4/2007 | Hayashi et al. |
| 2007/0108446 A1 | 5/2007 | Akimoto |
| 2007/0146008 A1 | 6/2007 | Tak et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252201 A1 | 11/2007 | Kito et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 * | 5/2008 | Li ....................... B82Y 10/00 257/291 |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149913 A1 | 6/2008 | Tanaka et al. |
| 2008/0166834 A1 | 7/2008 | Kim et al. |
| 2008/0175032 A1 | 7/2008 | Tanaka et al. |
| 2008/0182358 A1 | 7/2008 | Cowdery-Corvan et al. |
| 2008/0224133 A1 | 9/2008 | Park et al. |

(56) References Cited

U.S. PATENT DOCUMENTS

| | | |
|---|---|---|
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0197379 A1* | 8/2009 | Leslie ............... H01L 27/10876 438/253 |
| 2009/0230435 A1 | 9/2009 | Maejima |
| 2009/0278122 A1 | 11/2009 | Hosono et al. |
| 2009/0280600 A1 | 11/2009 | Hosono et al. |
| 2010/0038709 A1 | 2/2010 | Wang et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0237407 A1 | 9/2010 | Nojima |
| 2010/0279474 A1 | 11/2010 | Akimoto et al. |
| 2011/0014745 A1 | 1/2011 | Miyanaga |
| 2011/0101356 A1 | 5/2011 | Yamazaki |
| 2011/0121284 A1 | 5/2011 | Yamazaki et al. |
| 2011/0121383 A1 | 5/2011 | Forbes |
| 2011/0122670 A1 | 5/2011 | Yamazaki et al. |
| 2011/0127526 A1 | 6/2011 | Kawae et al. |
| 2011/0180763 A1* | 7/2011 | Utsuno .................. C04B 35/01 252/512 |
| 2011/0205777 A1 | 8/2011 | Kajigaya |
| 2011/0305074 A1 | 12/2011 | Lung et al. |
| 2012/0161228 A1 | 6/2012 | Weng et al. |
| 2013/0069052 A1 | 3/2013 | Sandhu |

FOREIGN PATENT DOCUMENTS

| | | |
|---|---|---|
| EP | 1134811 A | 9/2001 |
| EP | 1737044 A | 12/2006 |
| EP | 1746659 A | 1/2007 |
| EP | 2226847 A | 9/2010 |
| JP | 60-198861 A | 10/1985 |
| JP | 61-294854 A | 12/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-077432 A | 3/1994 |
| JP | 07-321228 A | 12/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319682 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-266143 A | 10/2007 |
| JP | 2009-016368 A | 1/2009 |
| JP | 2009-167087 A | 7/2009 |
| JP | 2009-212443 A | 9/2009 |
| JP | 2009-223971 A | 10/2009 |
| JP | 2009-246383 A | 10/2009 |
| JP | 2010-020863 A | 1/2010 |
| JP | 2010-118659 A | 5/2010 |
| JP | 2010-219386 A | 9/2010 |
| JP | 2010-225222 A | 10/2010 |
| JP | 2010-225946 A | 10/2010 |
| JP | 2010-282173 A | 12/2010 |
| JP | 2010-283338 A | 12/2010 |
| JP | 2011-040731 A | 2/2011 |
| KR | 0131189 | 11/1997 |
| TW | 200949944 | 12/2009 |
| TW | 201101498 | 1/2011 |
| WO | WO-2004/114391 | 12/2004 |
| WO | WO-2008/041716 | 4/2008 |
| WO | WO-2009/110623 | 9/2009 |
| WO | WO-2010/125986 | 11/2010 |
| WO | WO-2011/007682 | 1/2011 |

OTHER PUBLICATIONS

Pending Claims(U.S. Appl. No. 13/359,529), filed Jan. 17, 2012.
International Search Report (Application No. PCT/JP2012/055733) dated Jun. 5, 2012.
Written Opinion (Application No. PCT/JP2012/055733) dated Jun. 5, 2012.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn-O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium-Gallium-Zinc Oxide Tfts and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39,1:Invited Paper:Optically Isotropic Nano-Structured Liquid Crystal Composites for Display Applications", SID Digest '09 : SID International Symposium Digest of the Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

(56) References Cited

OTHER PUBLICATIONS

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review, B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 201280012501.0) dated Sep. 28, 2015.

Taiwanese Office Action (Application No. 101107470) dated Mar. 29, 2016.

* cited by examiner

● In
☾ Sn
· Zn
• O

● In
● Ga
● Zn
● O

MEMORY DEVICE AND METHOD FOR MANUFACTURING THE SAME

BACKGROUND OF THE INVENTION

1. Field of the Invention

The present invention relates to a memory device utilizing semiconductor properties and a method for manufacturing the memory device.

2. Description of the Related Art

A typical example of a widely used memory device is dynamic random access memory (DRAM), which is composed of one capacitor and one transistor (also referred to as cell transistor).

A planar transistor has been conventionally used to form a DRAM. More recently, a method using a recessed channel array transistor (RCAT) in which a gate is arranged three-dimensionally so as to prevent leakage current due to a short-channel effect is employed because of miniaturization of circuits (see Non-Patent Document 1).

REFERENCE

Non-Patent Document 1: K. Kim, "Technology for sub-50 nm DRAM and NAND flash manufacturing", *Technical Digest of International Electron Devices Meeting*, pp. 333-336, 2005.

SUMMARY OF THE INVENTION

In conventional DRAM, electric charge in a capacitor is lost when data is read out; thus, another write operation is necessary every time data is read out. Moreover, a transistor included in a storage element has a leakage current and electric charge flows into or out of a capacitor even when the transistor is not selected, so that a data retention period is short. For that reason, another write operation (refresh operation) is necessary at predetermined intervals.

In addition, the reduction in the area of memory elements is required along with higher integration of memory devices. However, it is difficult for the above-described planar transistor and RCAT, its variation, to further increase the degree of integration except by a reduction in the circuit line width. The area of a memory element utilizing such a conventional technique is 8 $F^2$ or more (F: minimum feature size) or 6 $F^2$ or more. A technique to achieve a much smaller area, for example, 4 $F^2$ is therefore expected.

The present invention is made in view of the foregoing technical background. An object of one embodiment of the present invention is therefore to provide a memory device that is as small in area as possible and has an extremely long data retention period.

In order to achieve the above object, the present invention focuses on the use of a transistor with extremely low leakage current as a cell transistor of a memory element in a memory device. Moreover, in order to reduce the area of a memory cell, the transistor is formed so that its source and drain are stacked in the vertical direction in a region where a bit line and a word line intersect each other. Further, a capacitor is stacked above the transistor.

That is, one embodiment of the present invention is a memory device in which a cell transistor and a capacitor are stacked over a substrate. The cell transistor includes a semiconductor layer over a bit line, and a gate insulating layer in contact with a side surface of the semiconductor layer. At least part of the side surface of the semiconductor layer is covered with a word line with the gate insulating layer placed between the part of the side surface of the semiconductor layer and the word line. The capacitor includes a capacitor electrode in contact with a top surface of the semiconductor layer, an insulating layer over the capacitor electrode, and a capacitor wiring over the insulating layer. The semiconductor layer in the cell transistor is formed using a semiconductor material having a wider band gap than silicon.

In the above manner, the cell transistor is formed in a region where the bit line and the word line intersect each other and the capacitor is formed to overlap with the cell transistor; therefore, the area of a memory element occupying the substrate can be extremely small. Further, in the cell transistor, a semiconductor material whose band gap is wider than that of silicon is used for the semiconductor layer in which a channel is formed, whereby the off-state current of the cell transistor is reduced and a data retention period can be extremely long.

According to another embodiment of the present invention, the semiconductor layer in the above memory device is formed using a material having a band gap greater than or equal to 2.5 eV and less than or equal to 4 eV.

According to another embodiment of the present invention, the semiconductor layer in the above memory device is formed using an oxide semiconductor.

The off-state current of the cell transistor can be extremely low particularly when a semiconductor having a band gap in the above range is used for the semiconductor layer in which a channel in the cell transistor is formed.

According to another embodiment of the present invention, the memory device further includes a driver circuit configured to drive the cell transistor and placed below the bit line.

By providing the driver circuit below the bit line as described above, the area occupied by the memory element can be reduced. The driver circuit is preferably formed using a single crystal semiconductor.

One embodiment of the present invention is a method for manufacturing a memory device including the following steps: forming a bit line on an insulating surface; forming a semiconductor layer over the bit line by using a semiconductor material having a wider band gap than silicon; forming a gate insulating layer covering the bit line and the semiconductor layer; forming a word line covering at least part of a side surface of the semiconductor layer with the gate insulating layer placed between the part of the side surface of the semiconductor layer and the word line; removing part of the gate insulating layer so as to expose a top surface of the semiconductor layer; forming a capacitor electrode in contact with the top surface of the semiconductor layer; and forming an insulating layer and a capacitor wiring to be stacked over the capacitor electrode.

According to the above-described method for manufacture, it is possible to fabricate a memory element that is very small in area and has an extremely long data retention period.

In this specification and the like, a bit line may be considered as a wiring connected to a sense amplifier or the like or as a wiring whose potential is amplified by a sense amplifier or the like. A word line may be considered as a wiring connected to a gate of a cell transistor.

The present invention can provide a semiconductor memory device that is as small in area as possible and has an extremely long data retention period.

DETAILED DESCRIPTION OF THE INVENTION

Figure 1A:
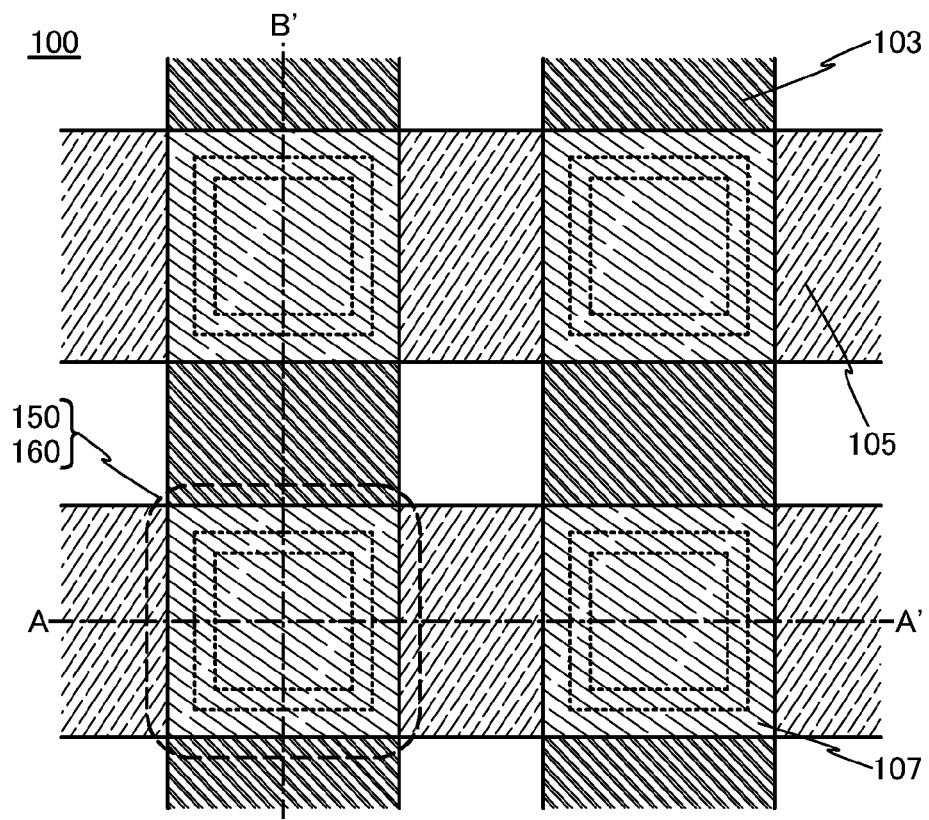
FIGS. 1A and 1B illustrate a memory device according to one embodiment of the present invention.

Embodiments will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description of the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, the scale is not necessarily limited to that illustrated in the drawings.

In this specification, a source of a cell transistor refers to an electrode or a region on the bit line side, and a drain of a cell transistor refers to an electrode or a region on the capacitor side.

Embodiment 1

In this embodiment, an example of the structure of a semiconductor memory device which is one embodiment of the present invention will be described with reference to FIGS. 1A and 1B and FIG. 6.

FIG. 1A is a schematic top view of a memory device 100. FIG. 1B is a schematic cross-sectional view along line A-A' in FIG. 1A. Note that a capacitor line 119 is not explicitly illustrated in FIG. 1A for clarity.

The memory device 100 includes a plurality of bit lines 103 arranged in parallel to each other and a plurality of word lines 105 perpendicular to the bit lines 103. A cell transistor 150 and a capacitor 160 are stacked in a region where the bit line 103 and the word line 105 overlap with each other.

The cell transistor 150 is formed over a base insulating layer 113 that covers a surface of a substrate 101. In the cell transistor 150, a semiconductor layer 109 and a capacitor electrode 107 are stacked over the bit line 103. Side surfaces of the semiconductor layer 109 are covered with the word line 105 with a gate insulating layer 111 placed therebetween. The cell transistor 150 is thus a vertical transistor in which the word line 105 that covers the side surfaces of the semiconductor layer 109 functions as a gate, the bit line 103 in contact with a bottom surface of the semiconductor layer 109 functions as a source, and the capacitor electrode 107 in contact with a top surface of the semiconductor layer 109 functions as a drain.

Figure 6:
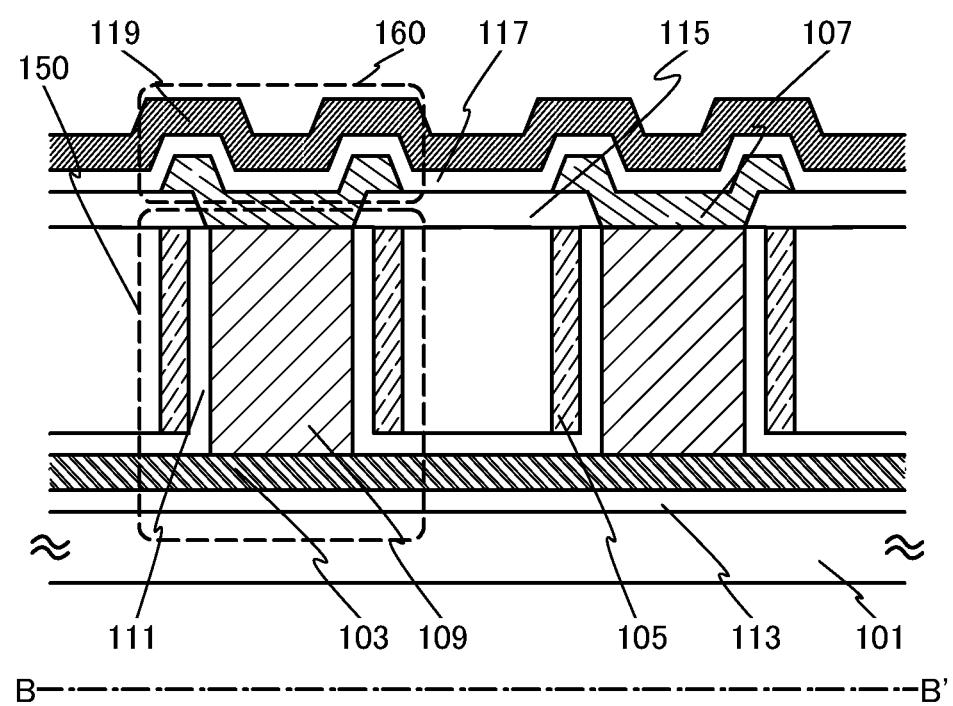
FIG. 6 illustrates a memory device according to one embodiment of the present invention.

FIG. 6 is a schematic cross-sectional view along line B-B', which is cut along the bit line 103 in FIG. 1A. As illustrated in FIG. 6, the word line 105 is formed without being interrupted so as to cover the side surfaces of the semiconductor layer 109 with the gate insulating layer 111 placed therebetween, so that the same potential can be applied to a plurality of cell transistors 150 that are connected to one word line 105 and arranged in one column. Adjacent word lines 105 are insulated from each other by an insulating layer.

The capacitor 160 is stacked above the cell transistor 150 and composed of the capacitor electrode 107, the capacitor line 119, and an insulating layer 117 interposed between the capacitor electrode 107 and the capacitor line 119.

In order to write data, electric charge is held in the capacitor 160 in the following manner: the cell transistor 150 is turned on, and a current corresponding to a difference in potential between the bit line 103 and the capacitor line 119 flows to the capacitor electrode 107 through a channel formed in the semiconductor layer 109. Then, the cell transistor 150 is turned off, whereby written data can be held.

When data is to be read out, the cell transistor 150 is turned on, so that a current corresponding to the electric charge held in the capacitor 160 flows to the bit line 103 through the channel formed in the semiconductor layer 109. Accordingly, a change in the potential of the bit line 103 at that time is detected by a readout circuit, such as a sense amplifier, connected to the bit line 103; thus, the data can be detected.

The widths of the cell transistor 150 and the capacitor 160 in the word line 105 direction can be substantially the same as the width of the bit line 103. The widths of the cell transistor 150 and the capacitor 160 in the bit line 103 direction can be substantially the same as the width of the word line 105. Consequently, the area of a surface of the substrate 101 occupied by the cell transistor 150 and the capacitor 160 can be extremely small.

The channel length of the cell transistor 150 can be controlled by a change in the thickness of the semiconductor layer 109. For that reason, the cell transistor 150 can have a given channel length even when the widths of the bit line 103, the word line 105, and the like are extremely small because of miniaturization, so that a short-channel effect can be reduced.

Although depending on the thickness of the gate insulating layer 111, the channel length of the cell transistor 150 is preferably, for example, 10 or more times, further preferably 20 or more times the length of the diagonal or the diameter of the semiconductor layer 109, in which case a short-channel effect can be reduced.

Figure 1B:
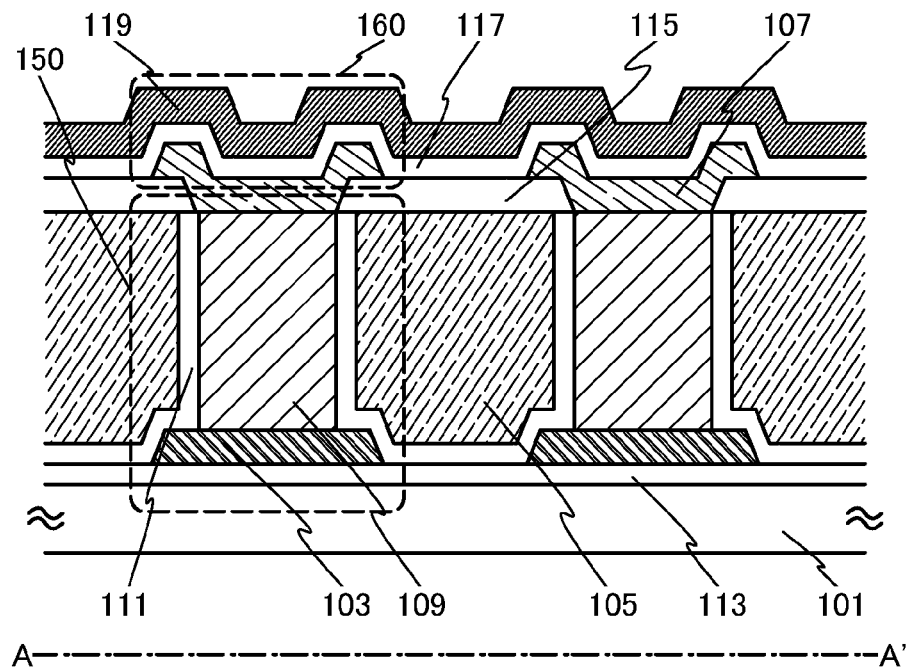

Note that FIGS. 1A and 1B and FIG. 6 show that the semiconductor layer 109 is prism-shaped; alternatively, the semiconductor layer 109 may be cylinder-shaped. For example, when the semiconductor layer 109 is prism-shaped, the effective width of the channel formed near the side surfaces of the semiconductor layer 109 can be large, so that the on-state current of the cell transistor 150 can be increased. In contrast, when the semiconductor layer 109 is cylinder-shaped, its side surface has no protrusion and thus a gate electric field is evenly applied to the side surface; consequently, the cell transistor 150 can have high reliability. In order to further increase the on-state current, the shape of the bottom surface of the semiconductor layer 109 may be, for example, a polygon that contains at least one interior angle larger than 180° (a concave polygon), such as a star polygon.

Although FIGS. 1A and 1B and FIG. 6 illustrate that the word line 105 covers the side surfaces of the semiconductor layer 109 with the gate insulating layer 111 placed therebetween, the word line 105 needs to be provided to cover at least part of the side surfaces of the semiconductor layer 109. For example, when the word line 105 is provided only on one of the side surfaces of the semiconductor layer 109 along the word line 105, the degree of integration in the bit line 103 direction can be increased. On the other hand, when the word line 105 covers the side surfaces of the semiconductor layer 109 as illustrated in FIGS. 1A and 1B and FIG. 6, the effective channel width of the cell transistor 150 can be large and the on-state current can be increased as a result.

Here, the use of a transistor with extremely low off-state current as the cell transistor 150 makes it possible for the capacitor 160 to retain electric charges for a long time. Thus, in the memory device 100, a data rewrite operation (refresh operation) at regular intervals is unnecessary or the frequency of refresh operations can be extremely low; consequently, the memory device 100 can substantially function as a non-volatile memory device.

An example of a transistor with extremely low off-state current is a transistor in which a semiconductor having a wider band gap than silicon is used for a semiconductor layer where a channel is formed. An example of the semiconductor having a wider band gap than silicon is a compound semiconductor, such as an oxide semiconductor and a nitride semiconductor.

Specifically, the band gap of silicon (1.1 eV) is not high enough to give very high off-resistance. It is necessary to use a wide band gap semiconductor with a band gap ranging from 2.5 eV to 4 eV, preferably from 3 eV to 3.8 eV. For example, an oxide semiconductor such as indium oxide or zinc oxide, a nitride semiconductor such as gallium nitride, a sulfide semiconductor such as zinc sulfide, or the like may be used.

For example, a transistor in which an oxide semiconductor layer is used for the semiconductor layer 109 where the channel is formed can be used as the cell transistor 150.

Since the cell transistor 150 is a transistor with extremely low off-state current, the size of the capacitor 160 for holding electric charge can be reduced. Further, the time needed for data writing and reading can be reduced with the reduction in the size of the capacitor 160, so that the memory device 100 can operate at high speed.

As described above, the memory device 100 exemplified in this embodiment is a memory device including a memory element which is composed of the cell transistor 150 and the capacitor 160 and occupies a very small area on the surface of the substrate 101. In addition, the use of a transistor with extremely low off-state current as the cell transistor 150 makes it possible for the memory device 100 to have an extremely long data retention period.

This embodiment can be combined with any of the other embodiments disclosed in this specification as appropriate.

Embodiment 2

In this embodiment, a method for manufacturing the memory device 100 exemplified in Embodiment 1 will be described with reference to FIGS. 2A to 2C and FIGS. 3A and 3B.

In this embodiment, with a few exceptions, just an outline is described. A known technique for manufacturing a semiconductor integrated circuit can be referred to for the details.

First, a base insulating layer 113 is formed over a substrate 101.

Although there is no particular limitation on a material that can be used as the substrate 101, the material needs to have at least heat resistance high enough to withstand heat treatment to be performed later. For example, the substrate 101 can be a glass substrate formed by a fusion process or a float process, a quartz substrate, a semiconductor substrate, a ceramic substrate, or the like. In the case where a glass substrate is used and the temperature of the heat treatment to be performed later is high, a glass substrate whose strain point is 730° C. or higher is preferably used.

The base insulating layer 113 has a function of inhibiting diffusion of impurities from the substrate 101. For example, an oxide insulating film, a nitride insulating film, or the like may be formed by a deposition method such as CVD or sputtering. When a semiconductor substrate is used as the substrate 101, the base insulating layer 113 may be formed by thermal oxidation of a surface of the substrate. The base insulating layer 113 does not have to be formed if not needed.

Then, a bit line 103 is formed over the base insulating layer 113. The bit line 103 is formed in such a manner that a conductive film is formed by a deposition method such as sputtering or CVD and processed by a known photolithography method.

Examples of a material used for the conductive film are an element selected from aluminum, chromium, copper, tantalum, titanium, molybdenum, tungsten, and the like; an alloy containing any of these elements as a component; and an alloy containing any of these elements in combination. The conductive film may have a single-layer structure or a stacked structure of two or more layers. Specifically, a film of refractory metal such as chromium, tantalum, titanium, molybdenum, or tungsten may be stacked on one or both of the bottom and top sides of a metal film of aluminum, copper, or the like. Further, one or more materials selected from manganese, magnesium, zirconium, beryllium, neodymium, and scandium may be used.

Then, a semiconductor film 129 is formed so as to cover the base insulating layer 113 and the bit line 103. Here, the semiconductor film 129 is preferably formed so that its thickness can be greater than the channel length of the cell transistor in advance in consideration of the fact that the thickness of the semiconductor film 129 over the bit line 103 is reduced in a later planarization step. In this embodiment, as the semiconductor film 129, an oxide semiconductor film is formed by sputtering, specifically, by sputtering with the use of an In—Ga—Zn-based oxide semiconductor target.

Note that the material used for the oxide semiconductor film is not limited to the above. An oxide semiconductor preferably contains at least indium (In) or zinc (Zn). In particular, an oxide semiconductor preferably contains In and Zn.

As a stabilizer for reducing variation in electric characteristics of transistors containing an oxide semiconductor, one or more selected from gallium (Ga), tin (Sn), hafnium (Hf), aluminum (Al), and lanthanoid is/are preferably contained.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Examples of an oxide semiconductor containing one kind of metal are indium oxide, tin oxide, and zinc oxide.

Examples of an oxide semiconductor containing two kinds of metal are In—Zn-based oxide, Sn—Zn-based oxide, Al—Zn-based oxide, Zn—Mg-based oxide, Sn—Mg-based oxide, In—Mg-based oxide, and In—Ga-based oxide.

Examples of an oxide semiconductor containing three kinds of metal are In—Ga—Zn-based oxide (also referred to as IGZO), In—Sn—Zn-based oxide, Sn—Ga—Zn-based oxide, In—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, Al—Ga—Zn-based oxide, and Sn—Al—Zn-based oxide.

Examples of an oxide semiconductor containing four kinds of metal are In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that here, for example, an In—Ga—Zn-based oxide refers to an oxide containing In, Ga, and Zn as its main components, and there is no particular limitation on the ratio of In, Ga, and Zn. The In—Ga—Zn-based oxide may contain a metal element other than In, Ga, and Zn.

Alternatively, the oxide semiconductor film can be formed using an oxide semiconductor obtained by adding $SiO_2$ to any of the above metal oxides.

Alternatively, the oxide semiconductor film can be formed using an oxide semiconductor represented by the chemical formula $InMO_3(ZnO)_m$ (m>0). Here, M represents one or more metal elements selected from Ga, Al, Mn, and Co.

For example, it is possible to use an In—Ga—Zn-based oxide with an atomic ratio of In:Ga:Zn=1:1:1 or In:Ga:Zn=2:2:1, or an oxide with an atomic ratio close to the above atomic ratios.

Alternatively, an In—Sn—Zn-based oxide with an atomic ratio of In:Sn:Zn=1:1:1, In:Sn:Zn=2:1:3, or In:Sn:Zn=2:1:5, or an oxide with an atomic ratio close to the above atomic ratios may be used.

Without limitation to the materials given above, a material with an appropriate composition can be used in accordance with needed semiconductor characteristics (e.g., mobility, threshold voltage, and variation). In order to obtain the needed semiconductor characteristics, it is preferable that the carrier density, impurity concentration, defect density, atomic ratio of a metal element to oxygen, interatomic distance, density, and the like be set to appropriate values.

For example, high mobility can be obtained relatively easily in the case of using an In—Sn—Zn-based oxide. However, even with an In—Ga—Zn-based oxide, the mobility can be increased by a reduction in bulk defect density.

Note that the expression "the composition of an oxide with an atomic ratio of In:Ga:Zn=a:b:c (a+b+c=1) is close to the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$, where r is 0.05, for example. The same applies to other oxides.

The oxide semiconductor may be either single crystal or non-single-crystal.

A non-single-crystal oxide semiconductor may be either amorphous or polycrystalline. Further, the oxide semiconductor may have a structure including a crystalline portion in an amorphous portion. Since the amorphous structure has many defects, a non-amorphous structure is preferred.

An oxide semiconductor in an amorphous state can have a flat surface with relative ease. Consequently, when a transistor is formed using the oxide semiconductor in an amorphous state, interface scattering can be reduced, and relatively high mobility can be obtained with relative ease.

In an oxide semiconductor having crystallinity, defects in the bulk can be further reduced. When a surface flatness is improved, mobility higher than that of an oxide semiconductor in an amorphous state can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, further preferably 0.1 nm or less.

Note that $R_a$ is obtained by expanding centerline average roughness, which is defined by JIS B 0601, into three dimensions so as to be applicable to a plane. Moreover, $R_a$ can be expressed as average value of the absolute values of deviations from a reference surface to a specific surface and is defined by Formula 1.

$$Ra = \frac{1}{S_0} \int_{y_1}^{y_2} \int_{x_1}^{x_2} |f(x,y) - Z_0| dx dy \qquad \text{[Formula 1]}$$

Note that in Formula 1, $S_0$ represents the area of a measurement surface (a rectangular region defined by four points represented by the coordinates $(x_1,y_1)$, $(x_1,y_2)$, $(x_2,y_1)$, and $(x_2,y_2)$), and $Z_0$ represents average height of the measurement surface. Further, $R_a$ can be measured using an atomic force microscope (AFM).

Here, it is preferable that the oxide semiconductor film be formed so as to contain impurities such as alkali metal, a hydrogen atom, a hydrogen molecule, water, a hydroxyl group, or a hydrogen compound as little as possible, for example, in such a manner that the impurities are prevented from being mixed into a sputtering target and a gas used for deposition. In addition, when a deposition apparatus is sufficiently evacuated during the deposition and the oxide semiconductor film is deposited while the substrate is heated, the concentration of impurities included in the deposited oxide semiconductor film can be lowered. After the oxide semiconductor is deposited, heat treatment may be performed to eliminate moisture or hydrogen in the oxide semiconductor film. The heat treatment may be performed at any time after the deposition of the oxide semiconductor film.

Next, an insulating film 143 is formed over the semiconductor film 129. The insulating film 143 is to be used as a hard mask for etching the semiconductor film 129 to form a semiconductor layer 109; therefore, for the insulating film 143, a material with high etching selectivity with the semiconductor film 129 and a thickness large enough to withstand the etching are employed.

Figure 2A:
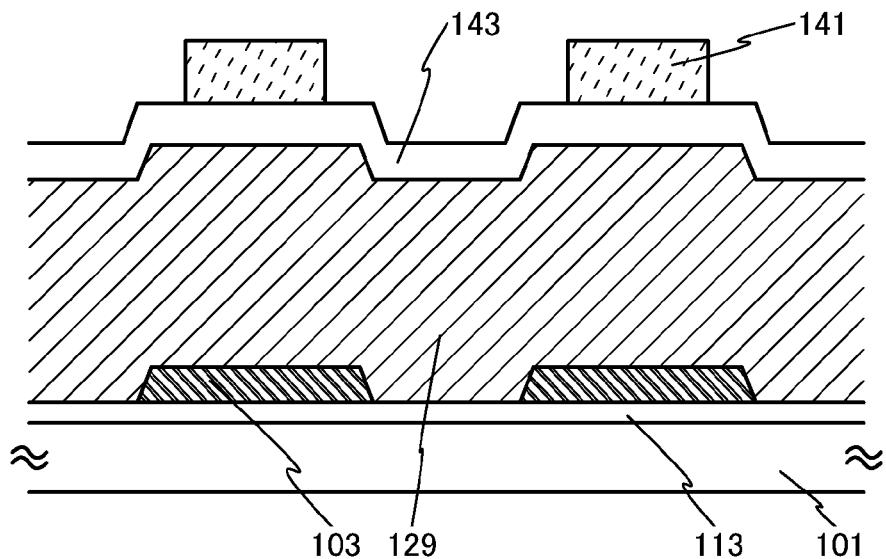
FIGS. 2A to 2C illustrate a method for manufacturing a memory device according to one embodiment of the present invention.

After that, a resist 141 is formed so as to be on and in contact with the insulating film 143 and overlap with a region that is to be the semiconductor layer 109 later. FIG. 2A illustrates a schematic cross-sectional view at this stage.

Then, a hard mask 145 is formed by etching the insulating film 143 in a region that is not covered with the resist 141. The resist 141 may be removed after the formation of the hard mask 145. After that, the semiconductor film 129 in a region that is not covered with the hard mask 145 is subjected to anisotropic etching, thereby obtaining the semiconductor layer 109. Here, etching conditions under which the hard mask 145, the bit line 103, and the base insulating layer 113 are hardly etched are selected.

It is preferable that anisotropic etching under conditions where the hard mask 145 is not etched be performed for etching the semiconductor film 129 and that the formed semiconductor layer 109 have a substantially columnar shape (including a cylinder shape and a polygonal prism shape). If the semiconductor layer 109 has a cone or pyramid shape, for example, the effective channel width of a formed cell transistor 150 decreases when getting closer to a drain (a capacitor electrode); thus, the on-state current is decreased.

Here, in the case where the resist 141 is not removed after the formation of the hard mask 145, the resist 141 is removed after the semiconductor layer 109 is formed.

Next, an insulating film 147 is formed to cover exposed portions of the base insulating layer 113, the bit line 103, the semiconductor layer 109, and the hard mask 145. Since part of the insulating film 147 serves as a gate insulating layer 111 later, the insulating film 147 is formed so that a portion in contact with a side face of the semiconductor layer 109 has a uniform thickness. The insulating film 147 can be formed by a deposition method such as CVD or sputtering. It is preferable that the amount of impurities containing hydrogen atoms, such as water, hydrogen, and a hydrogen compound, be sufficiently small in the insulating film 147 and at the interface between the insulating film 147 and the semiconductor layer 109.

The insulating film 147 can be a single layer or a stack of layers containing silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate to which nitrogen is added ($HfSi_xO_yN_z$ (x>0, y>0, z>0)), or hafnium aluminate ($HfAl_xO_yN_z$ to which nitrogen is added (x>0, y>0, z>0)), for example.

Figure 2B:
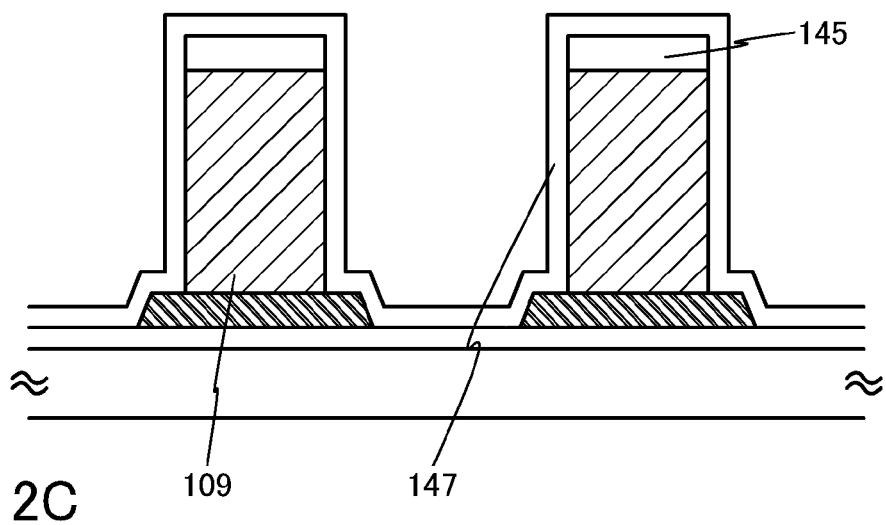

FIG. 2B illustrates a schematic cross-sectional view at this stage.

Then, a word line 105 is formed. First, a thick conductive film is deposited so as to fill regions where the semiconductor layer 109 is not formed. The conductive film can be formed by a deposition method such as sputtering or CVD with the use of a material similar to that of the conductive film forming the bit line 103. After that, a surface of the conductive film is planarized. Here, the planarization step is stopped when the insulating film 147 or the hard mask 145 is exposed.

The conductive film is selectively etched by a known photolithography method, thereby forming a pattern of the word lines 105 perpendicular to the bit lines 103.

Then, a thick insulating film is formed so as to fill spaces between the word lines 105 (not illustrated), and after that, a surface of the insulating film is planarized. The planarization step is stopped when the semiconductor layer 109 is exposed. Consequently, the hard mask 145 and part of the insulating film 147 above the semiconductor layer 109 are removed in this planarization step.

Figure 2C:
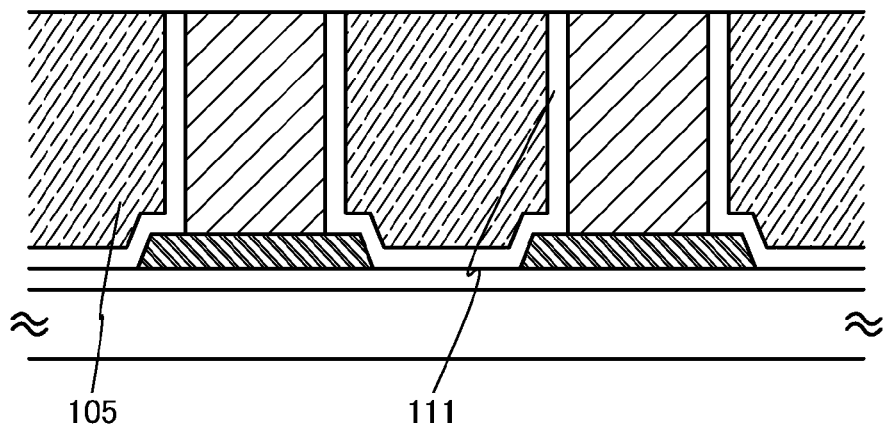

Through the above steps, the word line 105 and the gate insulating layer 111 are formed. FIG. 2C illustrates a schematic cross-sectional view at this stage.

Next, an insulating layer 115 is formed to cover a surface of the word line 105 and a top surface of the gate insulating layer 111. The insulating layer 115 is formed in such a manner that an insulating film is formed by a deposition method such as CVD or sputtering and then selectively etched so as to expose the semiconductor layer 109.

Figure 3A:
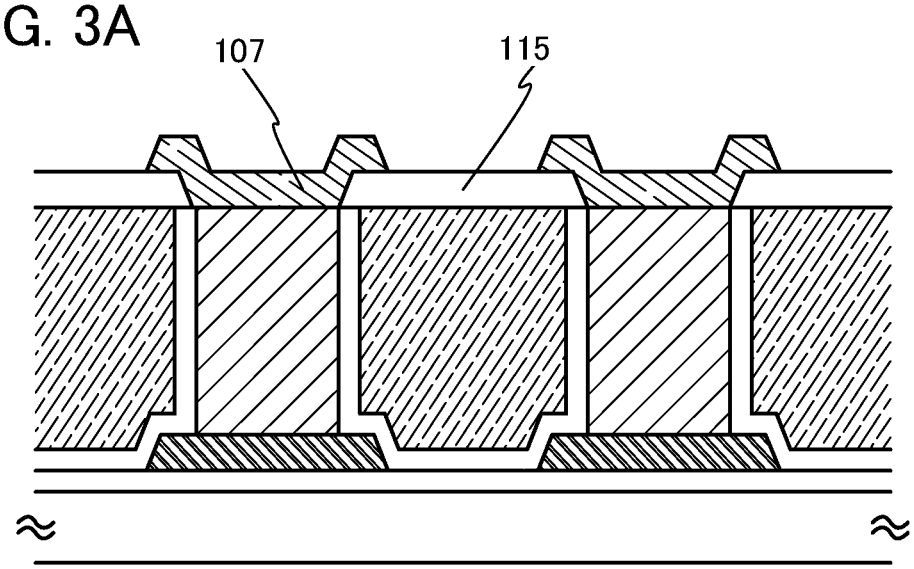
FIGS. 3A and 3B illustrate a method for manufacturing a memory device according to one embodiment of the present invention.

After that, a capacitor electrode 107 in contact with a top surface of the semiconductor layer 109 is formed. The capacitor electrode 107 can be formed in such a manner that a conductive film covering the insulating layer 115 and the semiconductor layer 109 is formed by a deposition method such as CVD or sputtering and then selectively etched. FIG. 3A illustrates a schematic cross-sectional view at this stage. The conductive film forming the capacitor electrode 107 can be formed using a material similar to that of the conductive film forming the bit line 103.

Figure 3B:
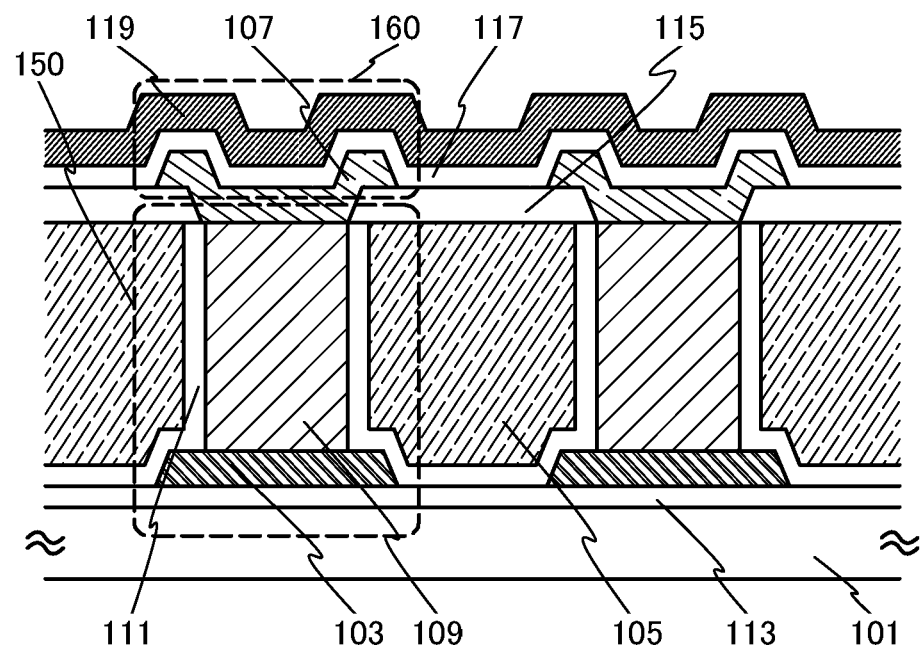

Next, an insulating layer 117 and a capacitor line 119 are formed, so that a capacitor 160 is formed over the semiconductor layer 109 (see FIG. 3B).

First, the insulating layer 117 is formed by a deposition method such as CVD, and the capacitor line 119 in contact with the insulating layer 117 is formed. The conductive film forming the capacitor line 119 can be formed using a material similar to that of the conductive film forming the bit line 103. Here, the capacitance of the capacitor 160 can be increased as the thickness of the insulating layer 117 is smaller and as the dielectric constant of the material used for the insulating layer 117 is higher. Note that the capacitor 160 may be formed to have relatively small capacitance because the off-state current of the cell transistor 150 fabricated in this embodiment is extremely low.

The capacitance of the capacitor 160 can be smaller as the off-state current of the cell transistor 150 is lower, that is, as the off-resistance of the cell transistor 150 is higher. For example, when the off-resistance of the cell transistor 150 is 100 times as high as that in general DRAM using silicon, the memory device can operate with the same frequency of refresh operations even if the capacitance of the capacitor 160 is reduced to one hundredth. On the other hand, when the capacitance of the capacitor 160 is the same as that in conventional DRAM, the frequency of refresh operations can be reduced up to one hundredth; consequently, power consumption of the device can be drastically reduced.

The off-resistance of the cell transistor 150 is inversely proportional to the concentration of carriers thermally excited in the semiconductor layer 109 in which the channel is formed. Since the band gap of silicon is 1.1 eV even in a state where there is no carrier caused by a donor or an acceptor (i.e., even in the case of an intrinsic semiconductor), the concentration of thermally excited carriers at room temperature (300 K) is approximately $1 \times 10^{11}$ cm$^{-3}$.

On the other hand, in the case of a semiconductor whose band gap is 3.2 eV, the concentration of thermally excited carriers is approximately $1 \times 10^{-7}$ cm$^{-3}$. When the electron mobility is the same, the resistivity is inversely proportional to the carrier concentration; therefore, the resistivity of the semiconductor whose band gap is 3.2 eV is 18 orders of magnitude higher than that of silicon.

The cell transistor 150 containing such a wide band gap semiconductor can have extremely low off-state current, so that electric charge held in the capacitor 160 can be retained for an extremely long time. Accordingly, the capacitance of the capacitor 160 can be reduced, and in addition, refresh operations can be eliminated or significantly reduced in frequency.

Through the above steps, it is possible to manufacture the memory device 100 including a plurality of memory elements which occupy a very small area on a substrate surface. Moreover, the memory device 100 manufactured through the above steps can have an extremely long data retention period; consequently, a data refresh operation is not needed or the frequency of data refresh operations is very low in the memory device 100.

This embodiment can be combined with any of the other embodiments disclosed in this specification as appropriate.

Embodiment 3

This embodiment describes a CAAC-OS (c-axis aligned crystalline oxide semiconductor) which has an amorphous portion and a crystalline portion where crystals are aligned in the c-axis direction.

The CAAC-OS is a new oxide semiconductor.

The CAAC-OS has a c-axis alignment and a triangular or hexagonal atomic arrangement when seen from the direction of an a-b plane, a top surface, or an interface.

In the CAAC-OS, metal atoms are arranged in a layered manner or metal atoms and oxygen atoms are arranged in a layered manner in the c-axis direction.

Further, in the CAAC-OS, the direction of the a-axis or the b-axis varies in the a-b plane (a rotation structure around the c-axis).

The CAAC-OS is a non-single-crystal in a broad sense.

The CAAC-OS has a triangular, hexagonal, regular triangular, or regular hexagonal atomic arrangement when seen from the direction perpendicular to the a-b plane.

In addition, the CAAC-OS is an oxide having a phase where metal atoms are arranged in a layered manner or metal atoms and oxygen atoms are arranged in a layered manner when seen from the direction perpendicular to the c-axis direction.

The CAAC-OS is not a single crystal, but this does not mean that the CAAC is composed of only an amorphous component.

Although the CAAC-OS includes a crystallized portion (crystalline portion), a boundary between one crystalline portion and another crystalline portion is not clear in some cases.

Nitrogen may be substituted for part of oxygen which is a constituent of the CAAC-OS.

The c-axes of the crystalline portions included in the CAAC-OS may be aligned in one direction (e.g., a direction perpendicular to a surface of a substrate where the CAAC-OS is formed or a surface of the CAAC-OS).

The normals of the a-b planes of the crystalline portions included in the CAAC-OS may be aligned in one direction (e.g., a direction perpendicular to a surface of a substrate where the CAAC-OS is formed or a surface of the CAAC-OS).

The CAAC-OS can be a conductor, a semiconductor, or an insulator depending on its composition or the like. The CAAC-OS transmits or does not transmit visible light depending on its composition or the like.

For example, the CAAC-OS which is formed into a film shape has a triangular or hexagonal atomic arrangement when observed from the direction perpendicular to a surface of the film or a surface of a substrate with an electron microscope.

Further, when the cross section of the film is observed with an electron microscope, metal atoms are arranged in a layered manner or metal atoms and oxygen atoms (or nitrogen atoms) are arranged in a layered manner.

Examples of a crystal structure of the CAAC-OS will be described with reference to FIGS. 7A to 7E, FIGS. 8A to 8C, and FIGS. 9A to 9C.

In FIGS. 7A to 7E, FIGS. 8A to 8C, and FIGS. 9A to 9C, the vertical direction corresponds to the c-axis direction and a plane perpendicular to the c-axis direction corresponds to the a-b plane.

In this embodiment, an "upper half" and a "lower half" refer to an upper half above the a-b plane and a lower half below the a-b plane (an upper half and a lower half with respect to the a-b plane).

Figure 7A:
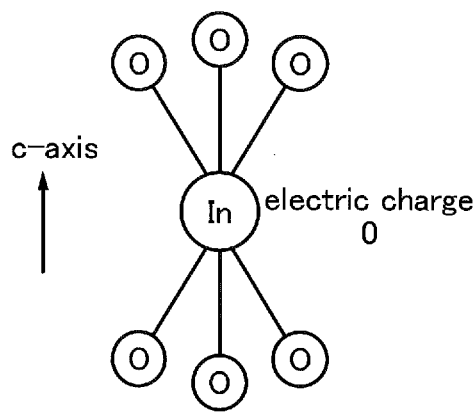
FIGS. 7A to 7E are examples of oxide semiconductors.

FIG. 7A illustrates a structure A including one hexacoordinate In atom and six tetracoordinate oxygen (hereinafter referred to as tetracoordinate O) atoms proximate to the In atom.

In this specification, a structure showing only oxygen atoms proximate to one metal atom is referred to as a small group.

The structure A is actually an octahedral structure, but is illustrated as a planar structure for simplicity.

Three tetracoordinate O atoms exist in each of the upper half and the lower half in the structure A. The electric charge of the small group in the structure A is 0.

Figure 7D:
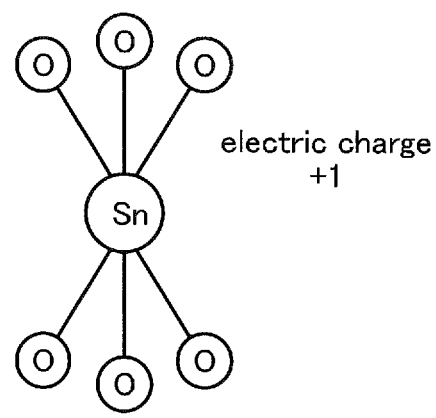
Figure 7B:
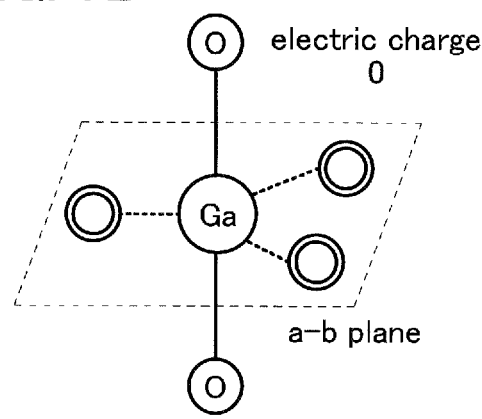

FIG. 7B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom.

All the three tricoordinate O atoms exist on the a-b plane. One tetracoordinate O atom exists in each of the upper half and the lower half in the structure B.

An In atom can also have the structure B because the In atom can have five ligands. The electric charge of the small group in the structure B is 0.

Figure 7E:
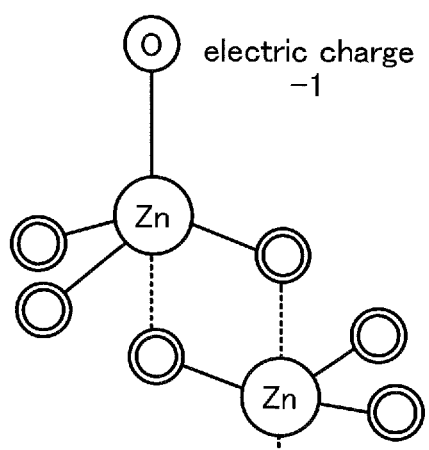
Figure 7C:
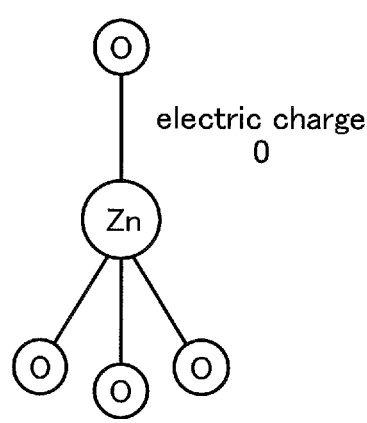

FIG. 7C illustrates a structure C including one tetracoordinate Zn atom and four tetracoordinate O atoms proximate to the Zn atom.

In the structure C, one tetracoordinate O atom exists in the upper half and three tetracoordinate O atoms exist in the lower half. The electric charge of the small group in the structure C is 0.

FIG. 7D illustrates a structure D including one hexacoordinate Sn atom and six tetracoordinate O atoms proximate to the Sn atom.

In the structure D, three tetracoordinate O atoms exist in each of the upper half and the lower half.

The electric charge of the small group in the structure D is +1.

FIG. 7E illustrates a structure E including two Zn atoms.

In the structure E, one tetracoordinate O atom exists in each of the upper half and the lower half. The electric charge of the small group in the structure E is −1.

In this embodiment, a plurality of small groups form a medium group, and a plurality of medium groups form a large group (also referred to as a unit cell).

A rule of bonding between the small groups is described below.

The three O atoms in the upper half with respect to the hexacoordinate In atom in FIG. 7A each have three proximate In atoms in the downward direction, and the three O atoms in the lower half each have three proximate In atoms in the upward direction.

The one O atom in the upper half with respect to the pentacoordinate Ga atom in FIG. 7B has one proximate Ga atom in the downward direction, and the one O atom in the lower half has one proximate Ga atom in the upward direction.

The one O atom in the upper half with respect to the tetracoordinate Zn atom in FIG. 7C has one proximate Zn atom in the downward direction, and the three O atoms in the lower half each have three proximate Zn atoms in the upward direction.

In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms.

Since the coordination number of the tetracoordinate O atom is 4, the sum of the number of metal atoms proximate to and below the O atom and the number of metal atoms proximate to and above the O atom is 4.

Accordingly, when the sum of the number of tetracoordinate O atoms above a metal atom and the number of tetracoordinate O atoms below another metal atom is 4, the two kinds of small groups including the metal atoms can be bonded to each other.

The reason therefor is described below. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction.

In addition, a medium group can also be formed in a different manner by combining a plurality of small groups so that the total electric charge of the layered structure is 0.

Figure 8A:
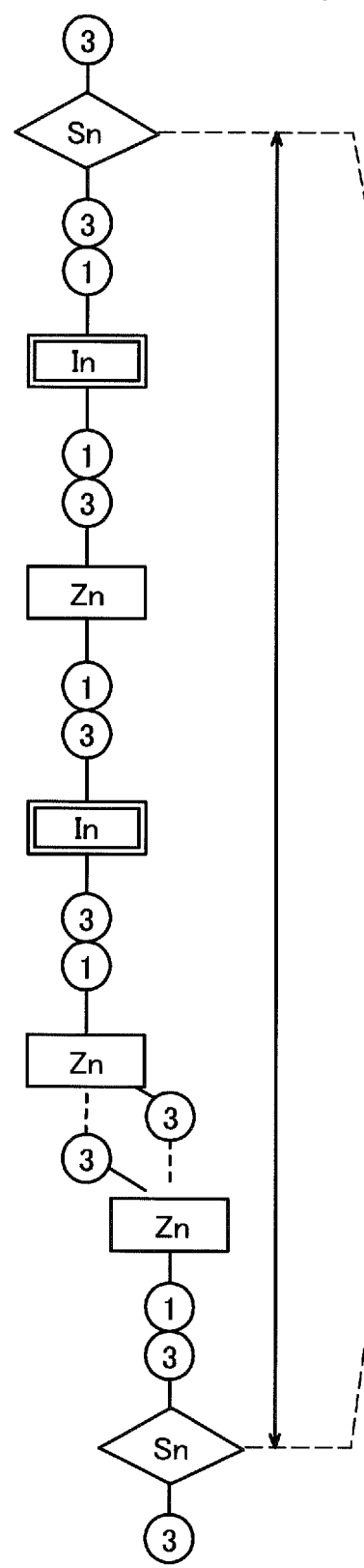
FIGS. 8A to 8C are examples of oxide semiconductors.

FIG. 8A illustrates a model of a medium group A included in a layered structure of an In—Sn—Zn—O-based material.

Figure 8B:

FIG. 8B illustrates a large group B including three medium groups.

Figure 8C:
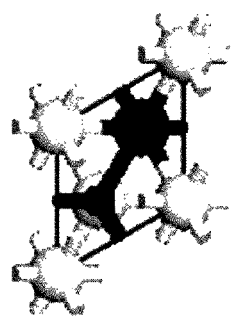

FIG. 8C illustrates an atomic arrangement where the layered structure shown in FIG. 8B is observed from the c-axis direction.

In the medium group A, a tricoordinate O atom is omitted for simplicity, and only the number of tetracoordinate O atoms is shown in a circle.

For example, three tetracoordinate O atoms existing in each of the upper half and the lower half with respect to a Sn atom are denoted by circled 3.

Similarly, in the medium group A, one tetracoordinate O atom existing in each of the upper half and the lower half with respect to an In atom is denoted by circled 1.

In addition, in the medium group A, a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half are shown.

In the medium group A included in the layered structure of the In—Sn—Zn—O-based material, in the order starting from the top, a Sn atom proximate to three tetracoordinate O atoms in each of the upper half and the lower half is bonded to an In atom proximate to one tetracoordinate O atom in each of the upper half and the lower half.

The In atom is bonded to a Zn atom proximate to three tetracoordinate O atoms in the upper half.

The Zn atom is bonded to an In atom proximate to three tetracoordinate O atoms in each of the upper half and the lower half through one tetracoordinate O atom in the lower half with respect to the Zn atom.

The In atom is bonded to a small group that includes two Zn atoms and is proximate to one tetracoordinate O atom in the upper half.

The small group is bonded to a Sn atom proximate to three tetracoordinate O atoms in each of the upper half and the lower half through one tetracoordinate O atom in the lower half with respect to the small group.

A plurality of such medium groups are bonded to form a large group.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1.

Therefore, electric charge of −1, by which the electric charge of +1 is canceled, is needed to form a layered structure including a Sn atom.

As a structure having electric charge of −1, the small group including two Zn atoms as in the structure E can be given.

For example, with one small group including two Zn atoms, electric charge of one small group including a Sn atom can be cancelled, so that the total electric charge of the layered structure can result in 0.

Specifically, by repeating the large group B, an In—Sn—Zn—O-based crystal ($In_2SnZn_3O_8$) can be obtained.

The layered structure of the In—Sn—Zn—O-based crystal can be expressed by a composition formula, $In_2SnZn_2O_7$ $(ZnO)_m$ (m is 0 or a natural number).

The variable m is preferably large because the larger the variable m, the higher the crystallinity of the In—Sn—Zn—O-based crystal.

The same applies to the case where an oxide semiconductor other than the In—Sn—Zn—O-based material is used.

Figure 9A:
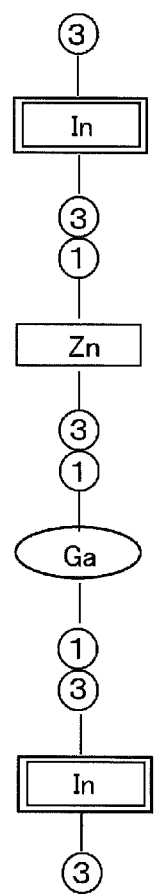
FIGS. 9A to 9C are examples of oxide semiconductors.

For example, FIG. 9A illustrates a model of a medium group L included in a layered structure of an In—Ga—Zn—O-based material.

In the medium group L included in the layered structure of the In—Ga—Zn—O-based material, in the order starting from the top, an In atom proximate to three tetracoordinate O atoms in each of the upper half and the lower half is bonded to a Zn atom proximate to one tetracoordinate O atom in the upper half.

The Zn atom is bonded to a Ga atom proximate to one tetracoordinate O atom in each of the upper half and the lower half through three tetracoordinate O atoms in the lower half with respect to the Zn atom.

The Ga atom is bonded to an In atom proximate to three tetracoordinate O atoms in each of the upper half and the lower half through one tetracoordinate O atom in the lower half with respect to the Ga atom.

A plurality of such medium groups are bonded to form a large group.

Figure 9B:
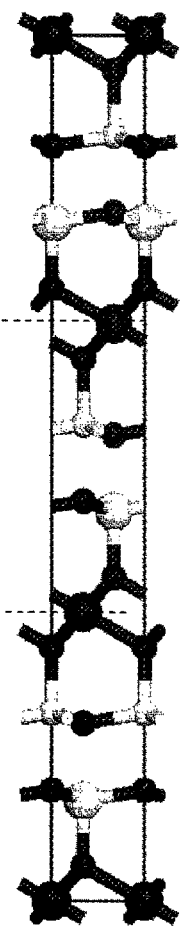

FIG. 9B illustrates a large group M including three medium groups.

Figure 9C:
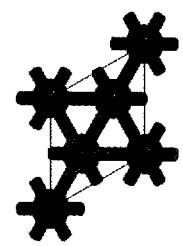
Figure 9C:
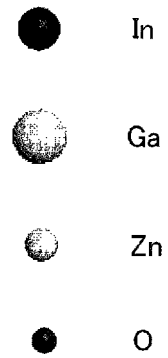

FIG. 9C illustrates an atomic arrangement where the layered structure shown in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of the In atom, the Zn atom, and the Ga atom is 0.

As a result, the total electric charge of a medium group having a combination of these small groups always results in 0.

In order to form the layered structure of the In—Ga—Zn—O-based material, a large group can be formed using not only the medium group L but also a medium group in which the arrangement of the In atom, the Ga atom, and the Zn atom is different from that of the medium group L.

This embodiment can be combined with any of the other embodiments disclosed in this specification as appropriate.

Embodiment 4

The actually measured field-effect mobility of an insulated gate transistor is lower than its inherent mobility because of a variety of reasons, which occurs not only in the case of using an oxide semiconductor.

One of causes for reduction in the mobility is a defect inside a semiconductor or a defect at an interface between the semiconductor and an insulating film. With a Levinson model, the field-effect mobility based on the assumption that no defect exists inside the semiconductor can be calculated theoretically.

Assuming a potential barrier (such as a grain boundary) exists in a semiconductor, the measured field-effect mobility of the semiconductor, denoted by $\mu$, can be expressed by Formula 2 where the inherent mobility of the semiconductor is $\mu_0$.

$$\mu = \mu_0 \exp\left(-\frac{E}{kT}\right) \quad \text{[Formula 2]}$$

In the formula, E denotes the height of the potential barrier, k denotes the Boltzmann constant, and T denotes the absolute temperature.

Further, on the assumption that the potential barrier is attributed to a defect, the height of the potential barrier can be expressed by Formula 3 according to the Levinson model.

$$E = \frac{e^2 N^2}{8\varepsilon n} = \frac{e^2 N^2 t}{8\varepsilon C_{ox} V_g} \quad \text{[Formula 3]}$$

In the formula, e denotes the elementary charge, N denotes the average defect density per unit area in a channel, s denotes the permittivity of the semiconductor, n denotes the number of carriers per unit area in the channel, $C_{ox}$ denotes the capacitance per unit area, $V_g$ denotes the gate voltage, and t denotes the thickness of the channel.

In the case where the thickness of the semiconductor layer is less than or equal to 30 nm, the thickness of the channel can be regarded as being the same as the thickness of the semiconductor layer.

The drain current $I_d$ in a linear region is expressed by Formula 4.

$$I_d = \frac{W \mu V_g V_d C_{ox}}{L} \exp\left(-\frac{E}{kT}\right) \quad \text{[Formula 4]}$$

In the formula, L denotes the channel length and W denotes the channel width, and L and W are each 10 μm in this example.

In addition, $V_d$ denotes the drain voltage.

Both sides of Formula 4 are divided by $V_g$ and then logarithms of both the sides are taken, resulting in Formula 5.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad \text{[Formula 5]}$$

The right side of Formula 5 is a function of $V_g$.

From Formula 5, it is found that the average defect density N can be obtained from the slope of a line taken with $\ln(I_d/V_g)$ as the ordinate and $1/V_g$ as the abscissa.

That is, the average defect density can be evaluated from the $I_d$-$V_g$ characteristics of the transistor.

The average defect density N of an oxide semiconductor in which the ratio of indium (In), tin (Sn), and zinc (Zn) is 1:1:1 is about $1\times10^{12}/\text{cm}^2$.

On the basis of the defect density obtained in this manner, or the like, $\mu_0$ can be calculated to be 120 $\text{cm}^2/\text{Vs}$.

The measured mobility of an In—Sn—Zn oxide including a defect is about 35 $\text{cm}^2/\text{Vs}$.

However, assuming that no defect exists inside an oxide semiconductor and at the interface between the oxide semiconductor and an insulating film, the mobility $\mu_0$ of the oxide semiconductor is estimated to be 120 $\text{cm}^2/\text{Vs}$.

Note that even when no defect exists inside the semiconductor, scattering at an interface between a channel and a gate insulating layer affects the transport property of the transistor. In other words, the mobility $\mu_1$ at a position that is a distance x away from the interface between the channel and the gate insulating layer is expressed by Formula 6.

$$\frac{1}{\mu_1} = \frac{1}{\mu_0} + \frac{D}{B}\exp\left(-\frac{x}{G}\right) \quad \text{[Formula 6]}$$

In the formula, D denotes the electric field in the gate direction, and B and G are constants. The values of B and G can be obtained from actual measurement results; according to the above measurement results, B is $4.75\times10^7$ cm/s and G is 10 nm (the depth to which the influence of interface scattering reaches).

As D increases (i.e., as the gate voltage increases), the second term of Formula 6 is increased and accordingly the mobility $\mu_1$ is decreased.

Figure 10:
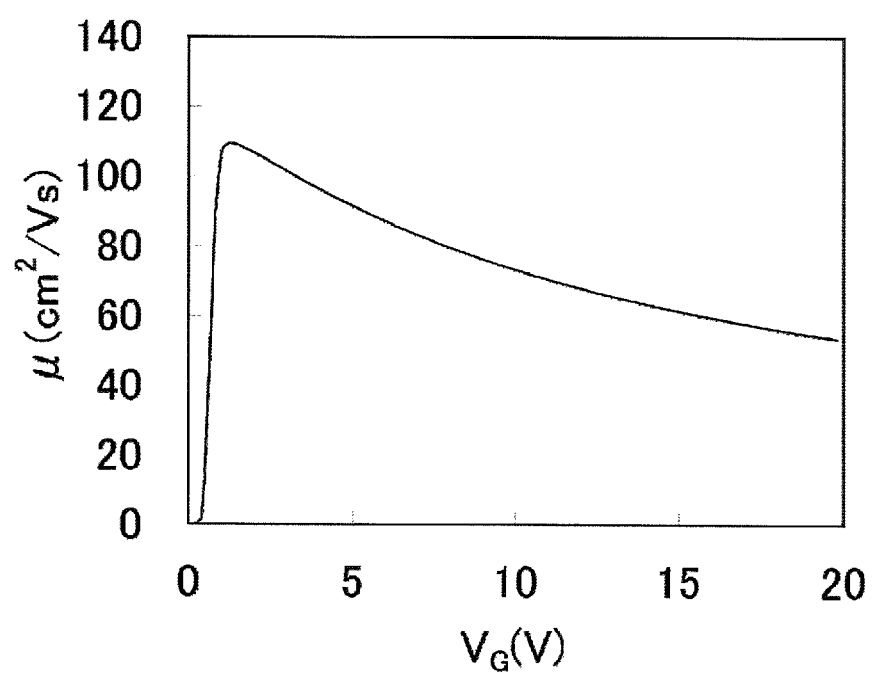
FIG. 10 illustrates a relation between gate voltage and field-effect mobility.

FIG. 10 shows calculation results E of the mobility $\mu$ of a transistor whose channel is formed in an ideal oxide semiconductor without a defect inside the semiconductor.

For the calculation, device simulation software, Sentaurus Device manufactured by Synopsys, Inc. was used For the calculation, the band gap, the electron affinity, the relative permittivity, and the thickness of the oxide semiconductor were set to 2.8 eV, 4.7 eV, 15, and 15 nm, respectively.

Those values were obtained according to measurement of a thin film of an oxide semiconductor that was formed by sputtering.

Further, the work functions of a gate, a source, and a drain of the transistor were set to 5.5 eV, 4.6 eV, and 4.6 eV, respectively.

The thickness of a gate insulating layer was set to 100 nm, and the relative permittivity thereof was set to 4.1. The channel length and the channel width were each 10 μm, and the drain voltage $V_d$ was set to 0.1 V.

As shown in the calculation results E, the mobility has a peak of more than 100 cm$^2$/Vs at a gate voltage that is a little over 1 V, and decreases as the gate voltage becomes higher because the influence of interface scattering is increased.

In order to reduce interface scattering, it is preferable that a surface of the semiconductor layer be flat at the atomic level (atomic layer flatness).

Characteristics of a minute transistor which was manufactured using an oxide semiconductor having such mobility were calculated.

The transistor used for calculation includes an oxide semiconductor film in which a channel formation region is provided between a pair of n-type semiconductor regions.

For the calculation, the resistivity of the pair of n-type semiconductor regions was set to 2×10$^{-3}$ Ωcm.

The channel length was set to 33 nm and the channel width was set to 40 nm for the calculation.

Further, a sidewall is provided on a side face of the gate electrode.

The calculation was performed under the condition that part of the semiconductor region which overlaps with the sidewall is an offset region.

For the calculation, device simulation software, Sentaurus Device manufactured by Synopsys, Inc. was used.

Figure 11A:
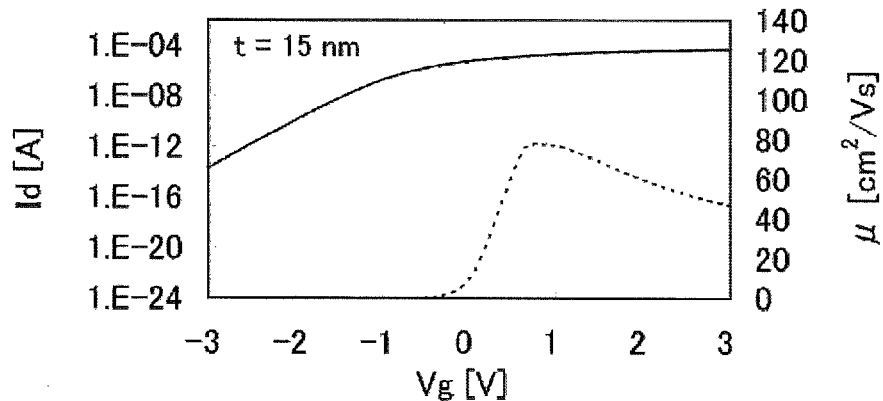
FIGS. 11A to 11C each illustrate a relation between gate voltage and drain current.
Figure 11B:
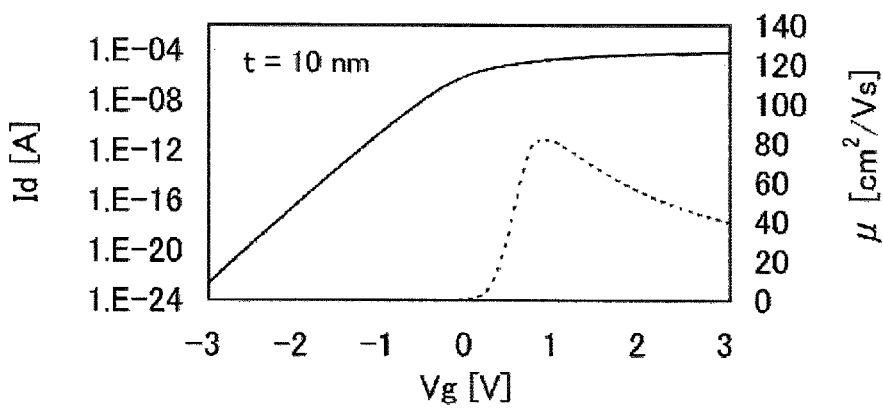
Figure 11C:
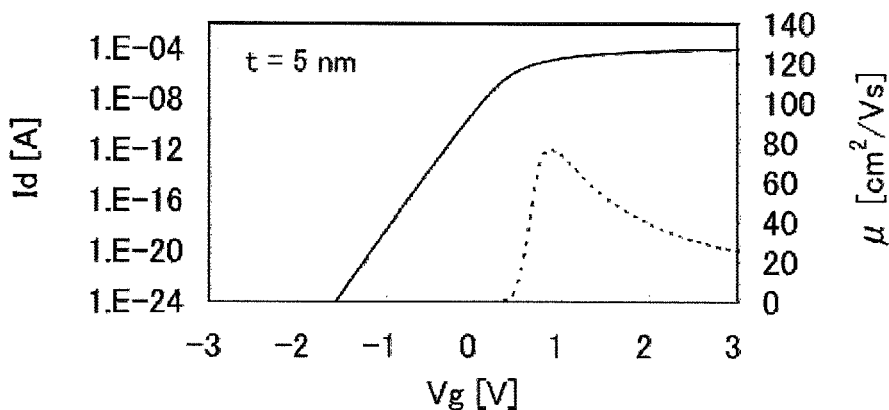

FIGS. 11A to 11C show the gate voltage ($V_g$: a potential difference between the gate and the source) dependence of the drain current ($I_d$, indicated by a solid line) and the mobility (μ, indicted by a dotted line) of the transistor.

The drain current $I_d$ was calculated under the assumption that the drain voltage (a potential difference between the drain and the source) was +1 V, and the mobility μ was calculated under the assumption that the drain voltage was +0.1 V.

FIG. 11A shows the calculation result where the thickness of the gate insulating layer was 15 nm.

FIG. 11B shows the calculation result where the thickness of the gate insulating layer was 10 nm.

FIG. 11C shows the calculation result where the thickness of the gate insulating layer was 5 nm.

As the gate insulating layer is thinner, the drain current $I_d$ in the off state (off-state current) in particular is significantly decreased.

In contrast, there is no remarkable change in the peak value of the mobility μ and the drain current $I_d$ in the on state (on-state current).

Figure 12A:
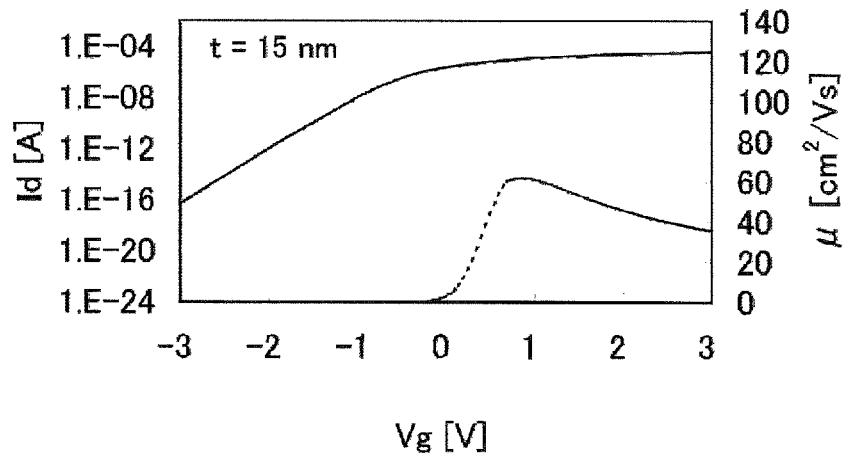
FIGS. 12A to 12C each illustrate a relation between gate voltage and drain current.
Figure 12B:
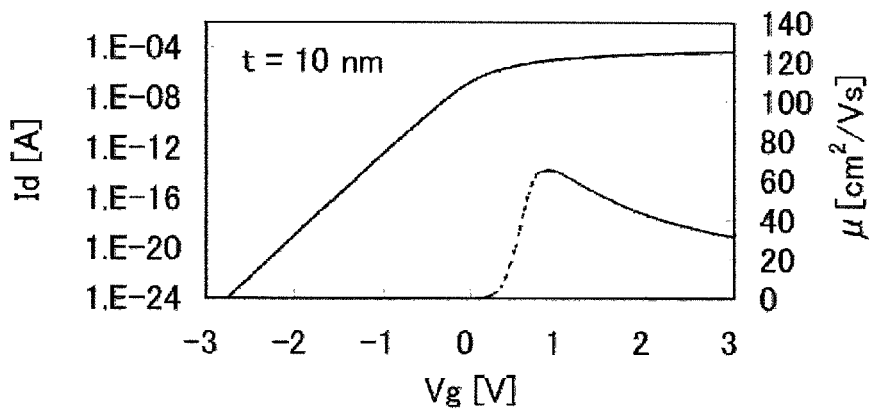
Figure 12C:
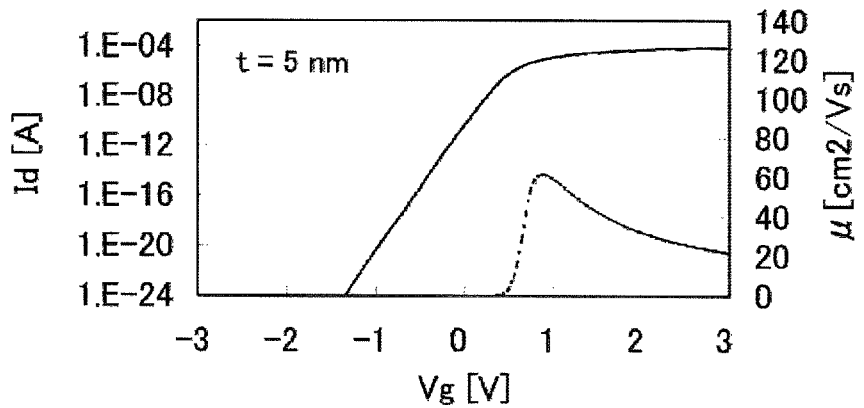

FIGS. 12A to 12C show the gate voltage $V_g$ dependence of the drain current $I_d$ (indicated by a solid line) and the mobility μ (indicated by a dotted line) of the transistor where the offset length (sidewall length) $L_{off}$ was 5 nm.

The drain current $I_d$ was calculated on the assumption the drain voltage was +1 V, and the mobility μ was calculated on the assumption the drain voltage was +0.1 V.

FIG. 12A shows the calculation result where the thickness of the gate insulating layer was 15 nm.

FIG. 12B shows the calculation result where the thickness of the gate insulating layer was 10 nm.

FIG. 12C shows the calculation result where the thickness of the gate insulating layer was 5 nm.

Figure 13A:
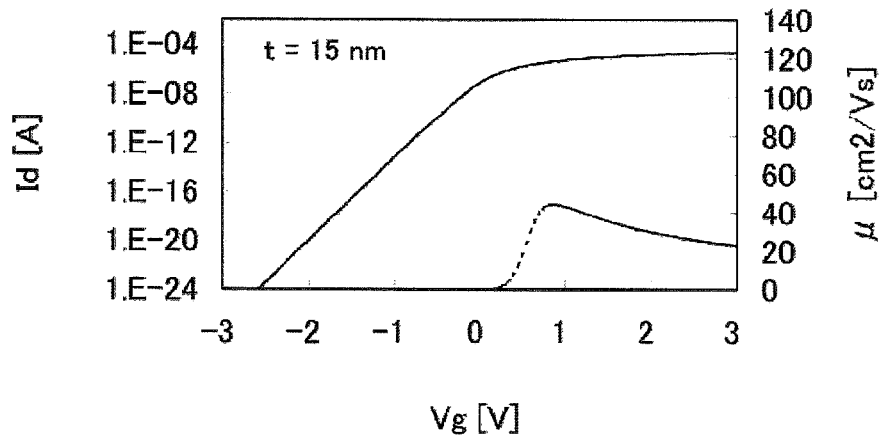
FIGS. 13A to 13C each illustrate a relation between gate voltage and drain current.
Figure 13B:
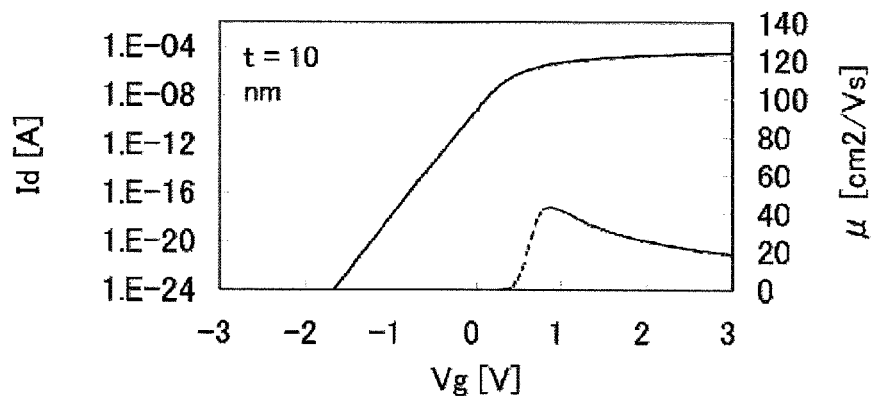
Figure 13C:
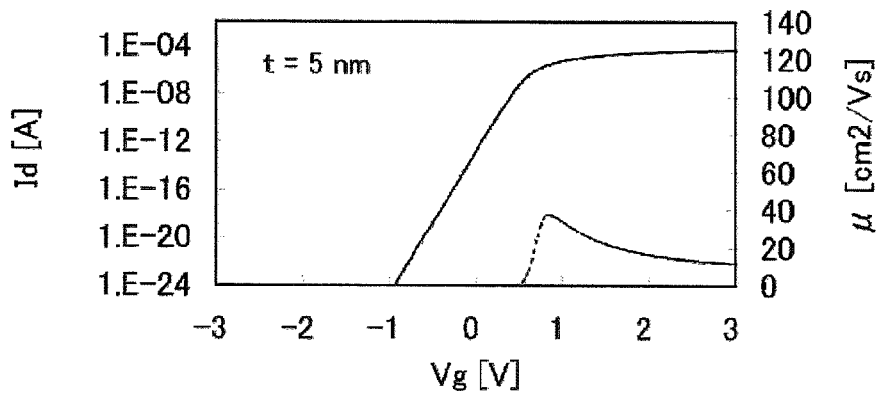

FIGS. 13A to 13C show the gate voltage dependence of the drain current $I_d$ (indicated by a solid line) and the mobility μ (indicated by a dotted line) of the transistor where the offset length (sidewall length) $L_{off}$ was 15 nm.

The drain current $I_d$ was calculated on the assumption that the drain voltage was +1 V, and the mobility p was calculated on the assumption that the drain voltage was +0.1 V.

FIG. 13A shows the calculation result where the thickness of the gate insulating layer was 15 nm.

FIG. 13B shows the calculation result where the thickness of the gate insulating layer was 10 nm.

FIG. 13C shows the calculation result where the thickness of the gate insulating layer was 5 nm.

In any of the structures, as the gate insulating layer is thinner, the off-state current is significantly decreased, whereas no remarkable change occurs in the peak value of the mobility μ and the on-state current.

The peak of the mobility μ is about 80 cm$^2$/Vs in FIGS. 11A to 11C, about 60 cm$^2$/Vs in FIGS. 12A to 12C, and about 40 cm$^2$/Vs in FIGS. 13A to 13C; thus, the peak of the mobility μ decreases as the offset length $L_{off}$ is increased.

The same applies to the off-state current.

The on-state current also decreases as the offset length $L_{off}$ is increased; however, the decrease in the on-state current is much more gradual than the decrease in the off-state current.

Further, any of the graphs shows that the drain current exceeds 10 μA, which is needed for a memory element or the like, at a gate voltage of around 1 V.

This embodiment can be combined with any of the other embodiments disclosed in this specification as appropriate.

Embodiment 5

A transistor including an oxide semiconductor containing In, Sn, and Zn can have favorable characteristics by deposition of the oxide semiconductor while heating a substrate or by heat treatment after deposition of an oxide semiconductor film.

The oxide semiconductor preferably contains 5 atomic % or more of each of In, Sn, and Zn.

By intentionally heating the substrate after the deposition of the oxide semiconductor film containing In, Sn, and Zn, the field-effect mobility of the transistor can be increased.

Moreover, the threshold voltage of an n-channel transistor can be shifted in the positive direction.

The positive shift of the threshold voltage of the n-channel transistor makes the absolute value of a voltage used for keeping the n-channel transistor off to decrease, so that power consumption can be reduced.

Further, the n-channel transistor can become a normally-off transistor by a positive shift of the threshold voltage such that the threshold voltage is 0 V or more.

Characteristics of transistors using an oxide semiconductor containing In, Sn, and Zn will be described below.
(Common Conditions of Samples A to C)

An oxide semiconductor film was formed over a substrate to have a thickness of 15 nm under the following conditions: a target having a composition ratio of In:Sn:Zn=1:1:1 was used; the gas flow rate was Ar/O$_2$=6/9 sccm; the deposition pressure was 0.4 Pa; and the deposition power was 100 W.

Next, the oxide semiconductor film was etched in an island shape.

Then, a tungsten layer was deposited over the oxide semiconductor film to have a thickness of 50 nm and was etched, so that a source electrode and a drain electrode were formed.

Next, a silicon oxynitride film (SiON) was formed as a gate insulating layer to have a thickness of 100 nm by plasma-enhanced CVD using silane gas (SiH$_4$) and dinitrogen monoxide (N$_2$O).

Then, a gate electrode was formed in the following manner: a tantalum nitride layer was formed to a thickness of 15 nm; a tungsten layer was formed to a thickness of 135 nm; and the layers were etched.

Further, a silicon oxynitride film (SiON) was formed to a thickness of 300 nm by plasma-enhanced CVD and a polyimide film was formed to a thickness of 1.5 μm, thereby forming an interlayer insulating film.

Next, a pad for measurement was formed in the following manner: a contact hole was formed in the interlayer insulating film; a first titanium film was formed to a thickness of 50 nm; an aluminum film was formed to a thickness of 100 nm; a second titanium film was formed to a thickness of 50 nm; and the films were etched.

In this manner, a semiconductor device having a transistor was fabricated.

(Sample A)

In Sample A, heating was not performed to the substrate during the deposition of the oxide semiconductor film.

Furthermore, in Sample A, heat treatment was not performed after the deposition of the oxide semiconductor film and before the etching of the oxide semiconductor film.

(Sample B)

In Sample B, the oxide semiconductor film was deposited with the substrate heated at 200° C.

Further, in Sample B, heat treatment was not performed after the deposition of the oxide semiconductor film and before the etching of the oxide semiconductor film.

The oxide semiconductor film was deposited while the substrate was heated in order to remove hydrogen serving as a donor in the oxide semiconductor film.

(Sample C)

In Sample C, the oxide semiconductor film was deposited with the substrate heated at 200° C.

Further, in Sample C, after the oxide semiconductor film was deposited and before the oxide semiconductor film was etched, heat treatment in a nitrogen atmosphere was performed at 650° C. for one hour and then heat treatment in an oxygen atmosphere was performed at 650° C. for one hour.

The heat treatment at 650° C. for one hour in a nitrogen atmosphere was performed in order to remove hydrogen serving as a donor in the oxide semiconductor film.

Oxygen is also removed by the heat treatment for removing hydrogen, which serves as a donor in the oxide semiconductor film, causing oxygen vacancy serving as a carrier in the oxide semiconductor film.

Hence, heat treatment was performed at 650° C. for one hour in an oxygen atmosphere to reduce oxygen vacancy.

(Characteristics of Transistors of Samples A to C)

Figure 14A:
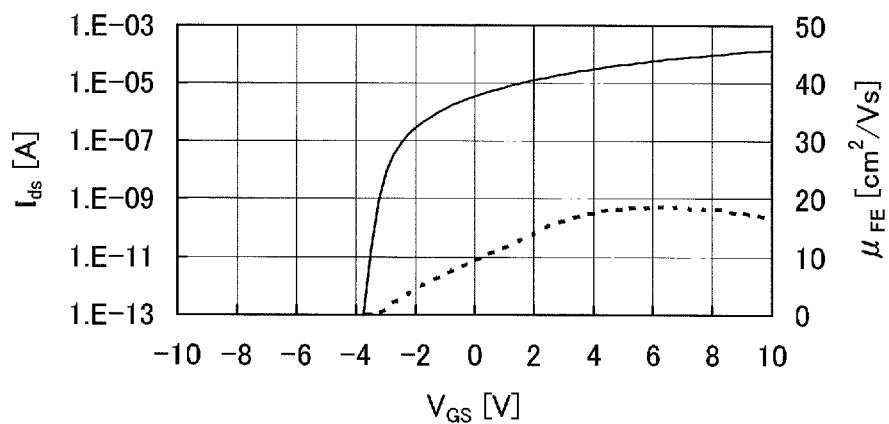
FIGS. 14A to 14C each illustrate characteristics of a transistor.

FIG. 14A shows initial characteristics of a transistor of Sample A.

Figure 14B:
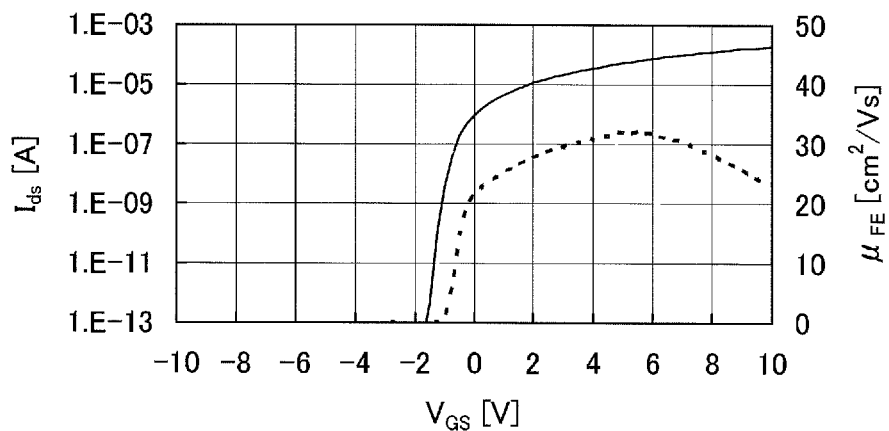

FIG. 14B shows initial characteristics of a transistor of Sample B.

Figure 14C:
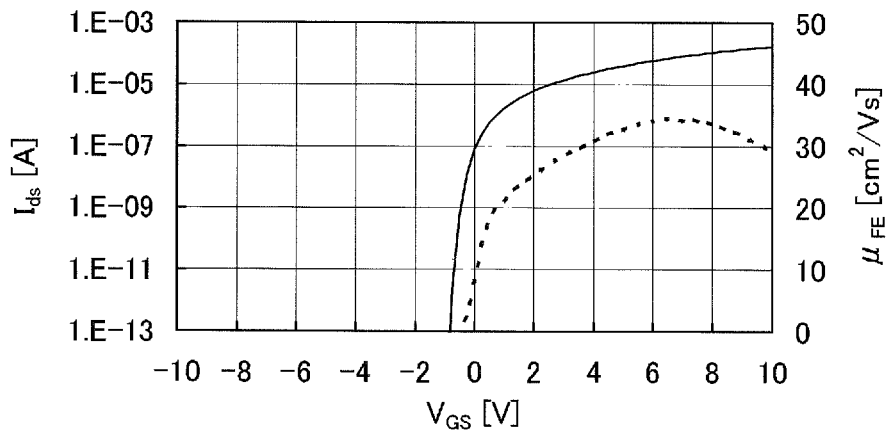

FIG. 14C shows initial characteristics of a transistor of Sample C.

The field-effect mobility of the transistor of Sample A was 18.8 cm$^2$/Vs.

The field-effect mobility of the transistor of Sample B was 32.2 cm$^2$/Vs.

The field-effect mobility of the transistor of Sample C was 34.5 cm$^2$/Vs.

According to observation of cross sections of oxide semiconductor films, which were formed by deposition methods similar to those of Samples A to C, with a transmission electron microscope (TEM), crystallinity was observed in samples formed by the deposition methods similar to those of Sample B and Sample C, substrates of which were heated during deposition.

Further, surprisingly, the samples, the substrates of which were heated during deposition, had a non-crystalline portion and a crystalline portion having a c-axis crystalline orientation.

In a conventional polycrystal, crystals in the crystalline portion are not aligned and point in different directions. This means that the samples, the substrates of which were heated during deposition, have a novel structure.

Comparison of FIGS. 14A to 14C brings understanding that heat treatment performed on the substrate during or after deposition can remove an hydrogen element serving as a donor, thereby shifting the threshold voltage of the n-channel transistor in the positive direction.

That is, the threshold voltage of Sample B with heating of the substrate during deposition is shifted in the positive direction as compared to the threshold voltage of Sample A without heating of the substrate during deposition.

In addition, it is found from comparison of Sample B and Sample C, the substrates of which were heated during deposition, that the threshold voltage of Sample C with the heat treatment after deposition is more shifted in the positive direction than the threshold voltage of Sample B without the heat treatment after deposition.

As the temperature of heat treatment is higher, a light element such as hydrogen is removed more easily; therefore, hydrogen is more likely to be removed as the temperature of heat treatment is higher.

Accordingly, it is likely that the threshold voltage can be more shifted in the positive direction by further increasing the temperature of the heat treatment during or after deposition.

(Results of Gate BT Stress Test of Sample B and Sample C)

A gate BT stress test was performed on Sample B (without heat treatment after deposition) and Sample C (with heat treatment after deposition).

First, the $V_{gs}$–$I_{ds}$ characteristics of each transistor were measured at a substrate temperature of 25° C. and $V_{ds}$ of 10 V to measure the characteristics of the transistor before heating and application of high positive voltage.

Next, the substrate temperature was set to 150° C. and $V_{ds}$ was set to 0.1 V.

After that, $V_{gs}$ of 20 V was applied to the gate insulating layer and was kept for 1 hour.

Then, $V_{gs}$ was set to 0 V.

Next, the $V_{gs}$–$I_{ds}$ characteristics of the transistor were measured at a substrate temperature of 25° C. and $V_{ds}$ of 10 V to measure the characteristics of the transistor after heating and application of high positive voltage.

Comparison of the characteristics of the transistor before and after heating and application of high positive voltage as described above is referred to as a positive BT test.

On the other hand, first, the $V_{gs}$–$I_{ds}$ characteristics of each transistor were measured at a substrate temperature of 25° C. and $V_{ds}$ of 10 V to measure the characteristics of the transistor before heating and application of high negative voltage.

Then, the substrate temperature was set to 150° C. and $V_{ds}$ was set to 0.1 V.

Next, $V_{gs}$ of −20 V was applied to the gate insulating layer and was kept for 1 hour.

Next, $V_{gs}$ was set to 0 V.

Then, the $V_{gs}$-$I_{ds}$ characteristics of the transistor were measured at a substrate temperature of 25° C. and $V_{ds}$ of 10 V to measure the characteristics of the transistor after heating and application of high negative voltage.

Comparison of the characteristics of the transistor before and after heating and application of high negative voltage as described above is referred to as a negative BT test.

Figure 15A:
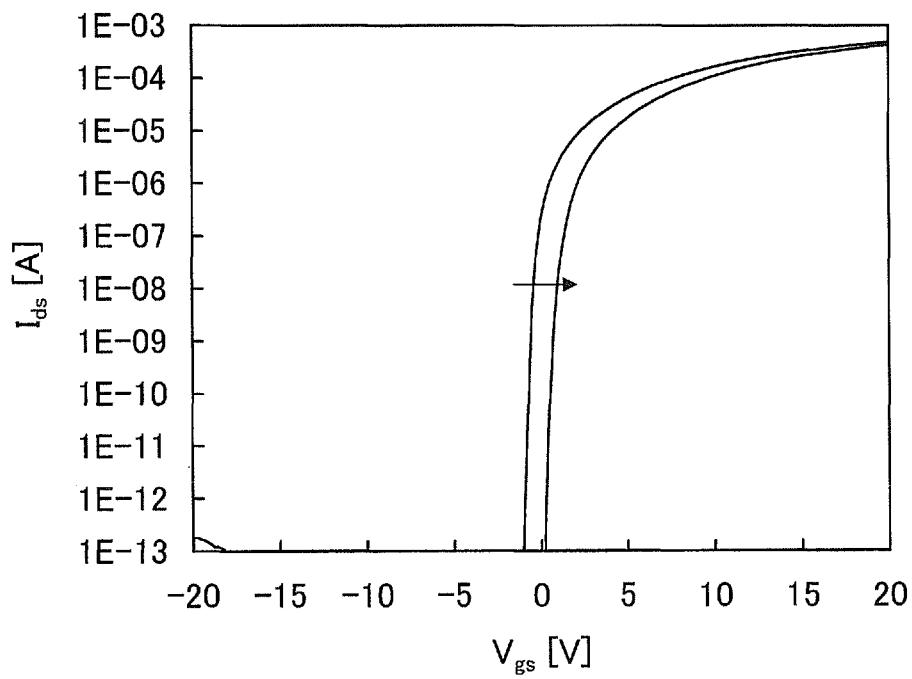
FIGS. 15A and 15B each illustrate characteristics of a transistor.
Figure 15B:
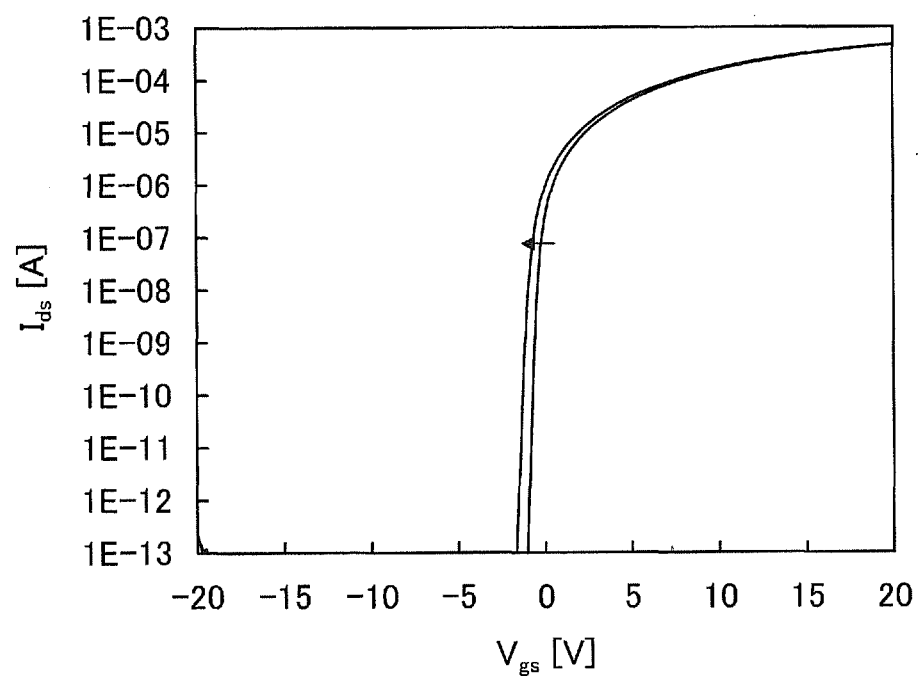

FIG. 15A shows the result of the positive BT test of Sample B. FIG. 15B shows the result of the negative BT test of Sample B.

Figure 16A:
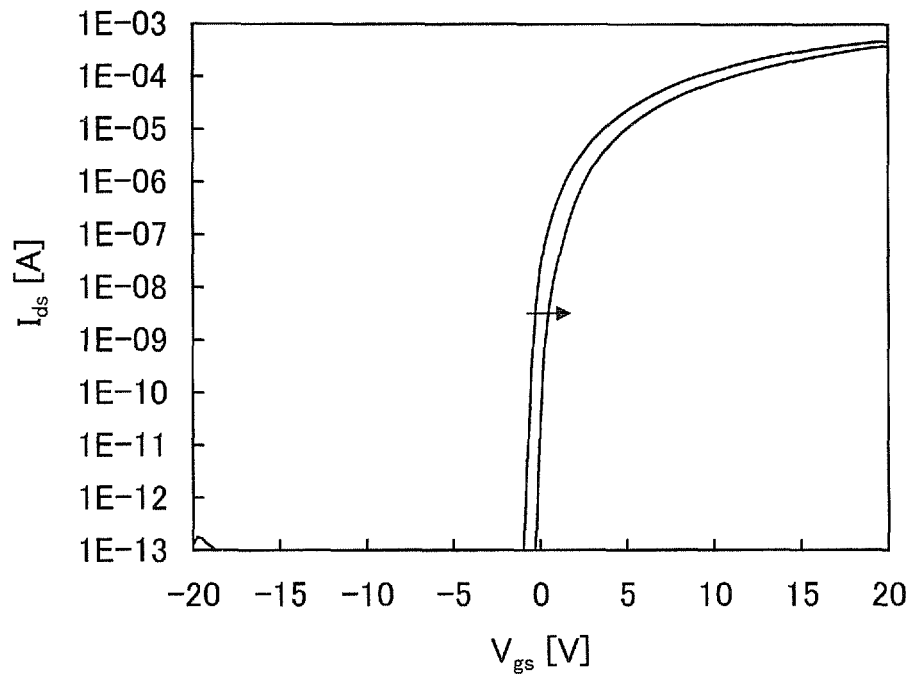
FIGS. 16A and 16B each illustrate characteristics of a transistor.
Figure 16B:
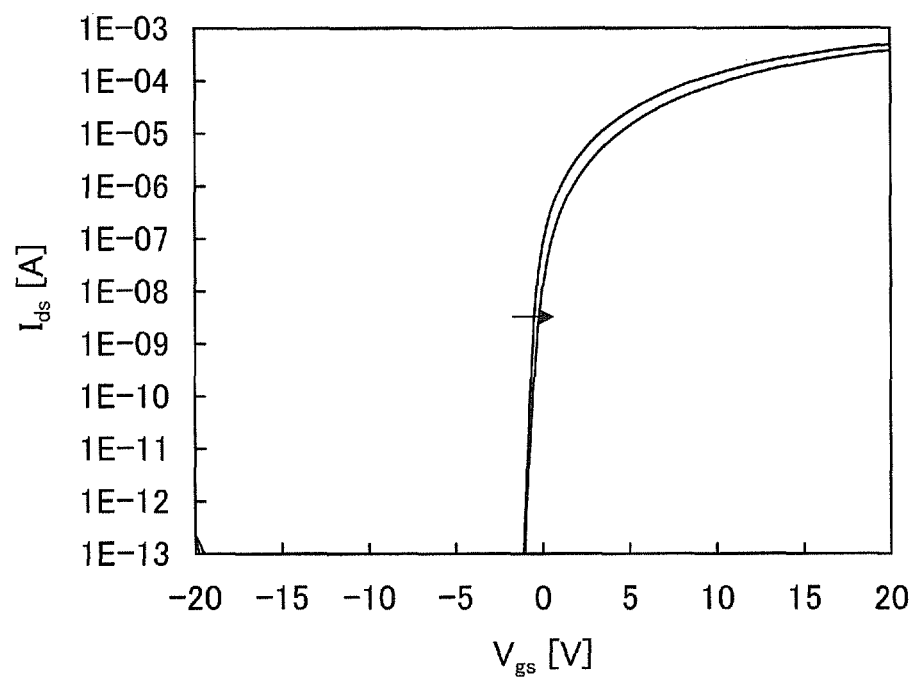

FIG. 16A shows the result of the positive BT test of Sample C. FIG. 16B shows the result of the negative BT test of Sample C.

Although the positive BT test and the negative BT test are tests for determining the deterioration degree of a transistor, it is found from FIG. 15A and FIG. 16A that the threshold voltage can be shifted in the positive direction by performing at least the positive BT test.

In particular, FIG. 15A reveals that the positive BT test made the transistor a normally-off transistor.

It is therefore found that performing the positive BT test in addition to the heat treatment in the fabrication process of the transistor makes it possible to promote a shift of the threshold voltage in the positive direction and consequently a normally-off transistor can be fabricated.

Figure 17:
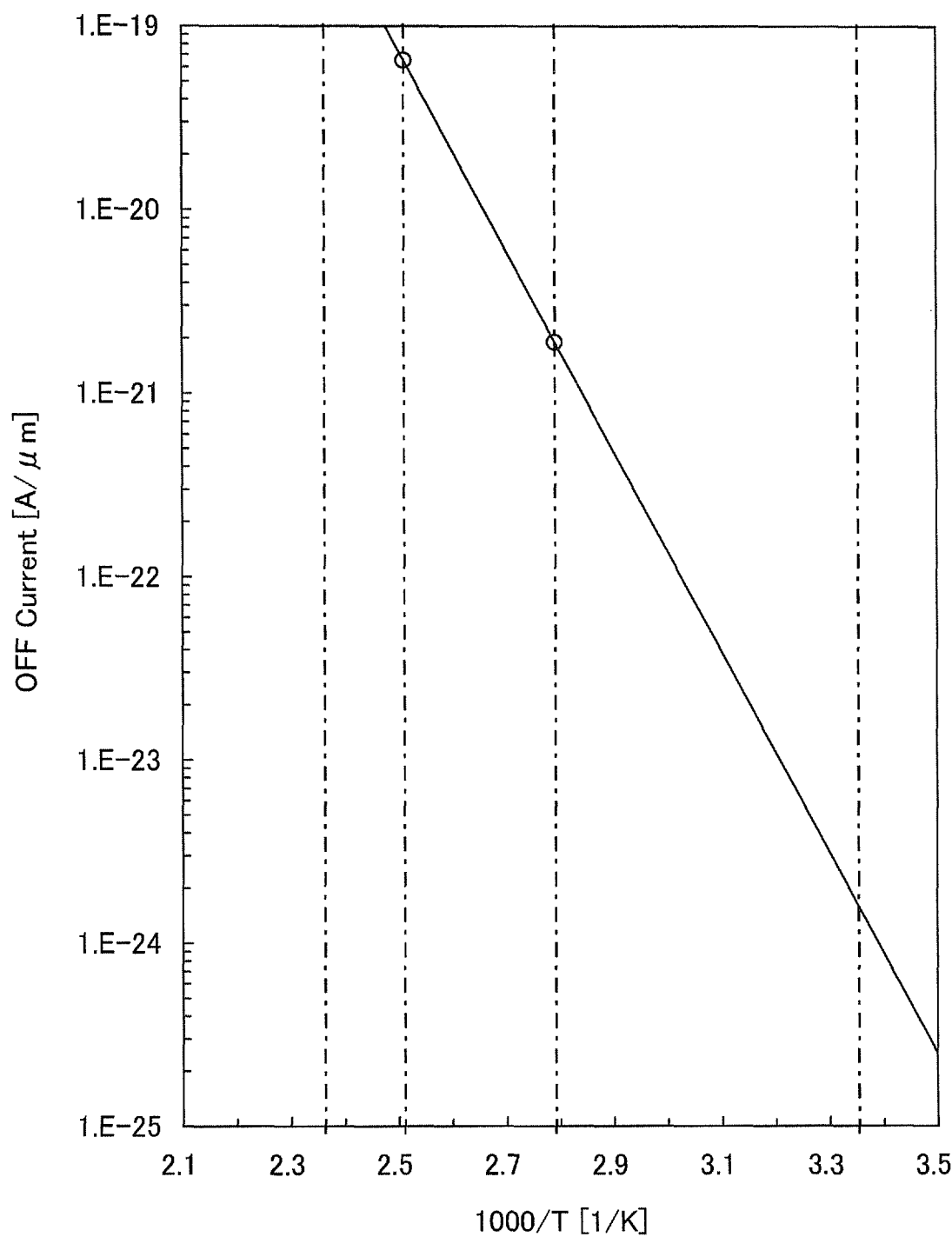
FIG. 17 illustrates temperature dependence of off-state current of a transistor.

FIG. 17 shows the relation between the off-state current of the transistor of Sample A and the inverse of the substrate temperature (absolute temperature) at measurement.

In FIG. 17, the horizontal axis represents a value (1000/T) obtained by multiplying the inverse of the substrate temperature at measurement by 1000.

The amount of current in FIG. 17 is the amount of current per micrometer in the channel width.

The off-state current was less than or equal to $1 \times 10^{-19}$ A at a substrate temperature of 125° C. (1000/T is about 2.51).

The off-state current was less than or equal to $1 \times 10^{-20}$ A at a substrate temperature of 85° C. (1000/T is about 2.79).

In other words, it was found that the off-state current of the transistor containing an oxide semiconductor is extremely low as compared to a transistor containing a silicon semiconductor.

The off-state current is decreased as the temperature decreases; therefore, it is clear that the off-state current at ordinary temperature is still lower.

This embodiment can be combined with any of the other embodiments disclosed in this specification as appropriate.

Embodiment 6

In this embodiment, an example of a memory device in which memory elements are stacked over a substrate where a semiconductor circuit is formed will be described with reference to FIG. 4 and FIG. 5.

Figure 4:
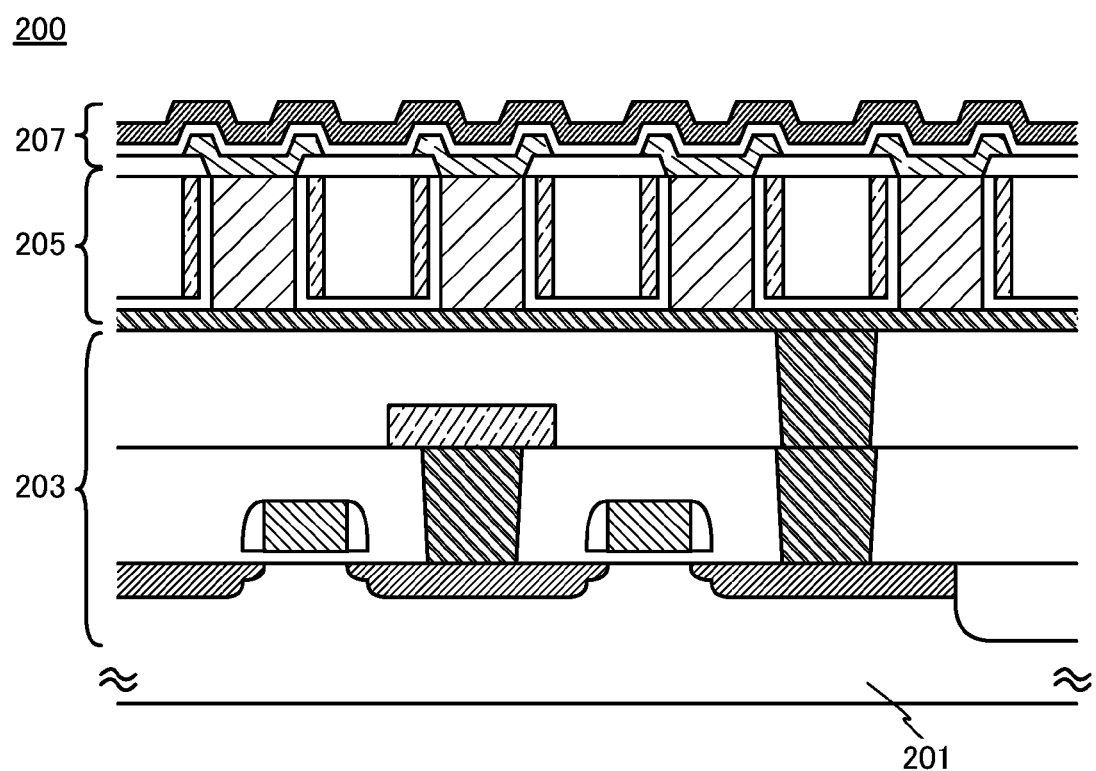
FIG. 4 illustrates a memory device according to one embodiment of the present invention.

FIG. 4 is a schematic cross-sectional view of a memory device 200. In the memory device 200, a circuit (a driver circuit 203) for driving a memory element, such as a sense amplifier and a decoder, is formed over a surface of a single crystal semiconductor substrate 201 using a known technique for forming a semiconductor integrated circuit. A cell transistor layer 205 is formed over the driver circuit 203, and a capacitor layer 207 is formed over the cell transistor layer 205.

Cell transistors and capacitors illustrated in FIG. 4 can be formed according to Embodiment 2.

A bit line of the cell transistor is electrically connected to the driver circuit 203 positioned therebelow through a contact plug. Accordingly, a potential signal output from the driver circuit 203 is input to each of the cell transistors through a common bit line.

Although not illustrated, a word line in the cell transistor layer 205 is electrically connected to the driver circuit 203 through a contact plug or the like in a similar manner. Thus, the on/off state of the cell transistor can be controlled in accordance with the potential output from the driver circuit 203.

In the memory device 200 with such a structure, the cell transistors are controlled by the driver circuit 203 positioned below the cell transistors, whereby write and read operations can be performed.

The integrated cell transistor layer 205 and capacitor layer 207 are stacked over the single crystal semiconductor substrate 201 in the above manner, whereby a more highly integrated memory device 200 which occupies a very small area on a substrate surface can be provided.

Here, a cell transistor layer and a capacitor layer can be further stacked over an insulating layer formed over the cell transistor layer 205 and the capacitor layer 207.

Figure 5:
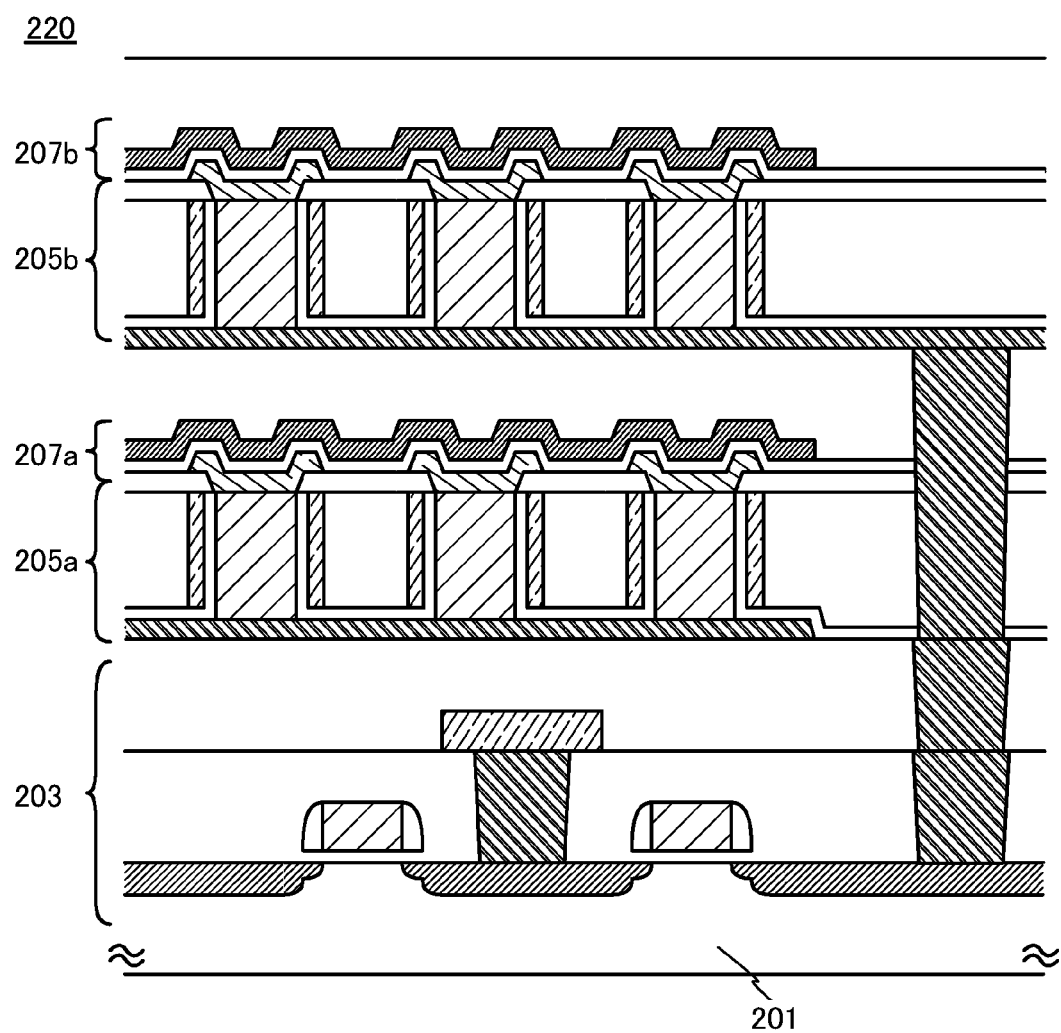
FIG. 5 illustrates a memory device according to one embodiment of the present invention.

As an example of the structure where cell transistor layers are stacked, FIG. 5 illustrates a schematic cross-sectional view of a memory device 220.

In the memory device 220, a cell transistor layer 205a, a capacitor layer 207a, a cell transistor layer 205b, and a capacitor layer 207b are stacked in this order over the driver circuit 203 formed over a surface of the single crystal semiconductor substrate 201.

FIG. 5 illustrates a schematic cross section including a region where a bit line in the cell transistor layer 205b, which is the second layer from the substrate, is electrically connected to the driver circuit 203 through a contact plug.

An insulating layer is provided between the capacitor layer 207a and the cell transistor layer 205b. In order to reduce parasitic capacitance generated between a capacitor wiring in the capacitor layer and a bit line and between the capacitor wiring and a word line, the insulating layer may be formed to have a sufficiently large thickness or formed using an insulating material with a low dielectric constant.

Note that this embodiment exemplifies the structure where two layers of memory elements composed of cell transistors and capacitors are stacked; however, without limitation to this, a stack of three or more layers can be employed. In addition, the structure where the cell transistors in the second layer are provided directly above the cell transistors in the first layer is shown here; alternatively, the cell transistors in the second layer may be shifted in the direction parallel to the substrate surface.

As described above, the area of a substrate surface occupied by memory cells is further reduced in the memory device 220 having a multilayer structure in which memory elements are stacked with an insulating layer placed therebetween; thus, a highly integrated memory device 220 can be provided.

This embodiment can be combined with any of the other embodiments disclosed in this specification as appropriate.

This application is based on Japanese Patent Application serial No. 2011-052448 and No. 2011-112648 filed with Japan Patent Office on Mar. 10, 2011 and May 19, 2011, respectively, the entire contents of which are hereby incorporated by reference.

What is claimed is:

1. A method for manufacturing a semiconductor device, comprising steps of:
   forming a bit line over an insulating surface;
   forming a semiconductor layer over the bit line, the semiconductor layer being prism-shaped or cylinder-shaped, and comprising a semiconductor material having a wider band gap than silicon;
   forming a gate insulating layer covering the bit line and the semiconductor layer;
   forming a word line covering at least part of a side face of the semiconductor layer with the gate insulating layer interposed therebetween;
   removing a part of the gate insulating layer so as to expose a top surface of the semiconductor layer;
   forming a capacitor electrode in contact with the top surface of the semiconductor layer; and
   stacking, in that order, an insulating layer and a capacitor line over the capacitor electrode,
   wherein a top surface of the semiconductor layer, a top surface of the gate insulating layer, and a top surface of the word line are in a same horizontal plane.

2. The method for manufacturing a semiconductor device according to claim 1,
   wherein the semiconductor layer is an oxide semiconductor layer.

3. The method for manufacturing a semiconductor device according to claim 1,
   wherein the semiconductor layer is a c-axis aligned crystalline oxide semiconductor.

4. The method for manufacturing a semiconductor device according to claim 1, the formation of the semiconductor layer including steps of:
   depositing an oxide semiconductor film on a heated substrate;
   etching the semiconductor layer to form the semiconductor layer; and
   performing a heat treatment prior to the etching step.

5. A method for manufacturing a semiconductor device, comprising steps of:
   forming a bit line over an insulating surface;
   forming a semiconductor layer over the bit line;
   forming a gate insulating layer covering the bit line and the semiconductor layer;
   forming a word line covering at least part of a side face of the semiconductor layer with the gate insulating layer interposed therebetween;
   removing a part of the gate insulating layer so as to expose a top surface of the semiconductor layer;
   forming a capacitor electrode in contact with the top surface of the semiconductor layer; and
   forming an insulating layer over the capacitor electrode,
   wherein a top surface of the semiconductor layer, a top surface of the gate insulating layer, and a top surface of the word line are in a same horizontal plane.

6. The method for manufacturing a semiconductor device according to claim 5,
   wherein the semiconductor layer is an oxide semiconductor layer.

7. The method for manufacturing a semiconductor device according to claim 5,
   wherein the semiconductor layer comprises a semiconductor material having a wider band gap than silicon.

8. A method for manufacturing a semiconductor device, comprising steps of:
   forming a semiconductor layer over a substrate, the semiconductor layer including a channel formation region which extends vertically to the substrate;
   forming a gate insulating layer covering the semiconductor layer;
   forming a word line covering at least part of a side face of the semiconductor layer with the gate insulating layer interposed therebetween;
   removing a part of the gate insulating layer so as to expose a top surface of the semiconductor layer;
   forming a capacitor electrode in contact with the top surface of the semiconductor layer; and
   forming an insulating layer over the capacitor electrode,
   wherein a top surface of the semiconductor layer, a top surface of the gate insulating layer, and a top surface of the word line are in a same horizontal plane.

9. The method for manufacturing a semiconductor device according to claim 8,
   wherein the semiconductor layer is an oxide semiconductor layer.

10. The method for manufacturing a semiconductor device according to claim 8,
    wherein the semiconductor layer comprises a semiconductor material having a wider band gap than silicon.

* * * * *